(12) United States Patent
Takada et al.

(10) Patent No.: US 10,558,307 B2
(45) Date of Patent: Feb. 11, 2020

(54) TOUCHSCREEN WITH SWITCHING CIRCUIT FOR CHANGING THE NUMBER OF CONNECTED DETECTION ELECTRODES

(71) Applicant: Japan Display Inc., Tokyo (JP)

(72) Inventors: Naoki Takada, Tokyo (JP); Hayato Kurasawa, Tokyo (JP); Koji Noguchi, Tokyo (JP); Takayuki Nakanishi, Tokyo (JP); Yasuyuki Teranishi, Tokyo (JP)

(73) Assignee: Japan Display Inc., Tokyo (JP)

( * ) Notice: Subject to any disclaimer, the term of this patent is extended or adjusted under 35 U.S.C. 154(b) by 79 days.

(21) Appl. No.: 15/903,897

(22) Filed: Feb. 23, 2018

(65) Prior Publication Data

US 2018/0246596 A1    Aug. 30, 2018

(30) Foreign Application Priority Data

Feb. 28, 2017 (JP) .................... 2017-037470

(51) Int. Cl.
*G06F 3/044* (2006.01)
*H03K 17/96* (2006.01)
*G06F 3/041* (2006.01)

(52) U.S. Cl.
CPC ............ *G06F 3/044* (2013.01); *G06F 3/0412* (2013.01); *G06F 3/0416* (2013.01); *G06F 3/0418* (2013.01); *H03K 17/962* (2013.01); *G06F 2203/04108* (2013.01)

(58) Field of Classification Search
CPC ............ G06F 3/0416; G06F 3/041661; G06F 3/044–0448
See application file for complete search history.

(56) References Cited

U.S. PATENT DOCUMENTS

| | | | |
|---|---|---|---|
| 9,335,859 B2 * | 5/2016 | Small | G06F 3/0416 |
| 9,921,675 B2 * | 3/2018 | Lai | G06F 3/0412 |
| 2008/0122798 A1 * | 5/2008 | Koshiyama | G06F 3/0412 345/173 |
| 2013/0342498 A1 | 12/2013 | Kim et al. | |
| 2014/0049486 A1 | 2/2014 | Kim et al. | |
| 2014/0049508 A1 | 2/2014 | Kim et al. | |
| 2014/0362042 A1 * | 12/2014 | Noguchi | G06F 3/0412 345/174 |
| 2015/0277648 A1 * | 10/2015 | Small | G06F 3/0416 345/174 |

* cited by examiner

*Primary Examiner* — Gene W Lee
(74) *Attorney, Agent, or Firm* — K&L Gates LLP

(57) ABSTRACT

A display device includes a substrate, a plurality of detection electrodes, a drive circuit, a detector, and a first switching circuit. The detection electrodes are provided in a display area of the substrate. The drive circuit supplies a drive signal to the detection electrodes. The detector receives, from the detection electrodes, a detection signal corresponding to a capacitance change in the detection electrodes occurring when the drive signal is supplied. The first switching circuit is coupled to the detector via wiring and provided between the detection electrodes and the detector. The first switching circuit changes the number of detection electrodes electrically coupled to one of the wiring based on the detection signal.

16 Claims, 33 Drawing Sheets

TOUCHSCREEN WITH SWITCHING CIRCUIT FOR CHANGING THE NUMBER OF CONNECTED DETECTION ELECTRODES

CROSS-REFERENCE TO RELATED APPLICATIONS

This application claims priority from Japanese Application No. 2017-037470, filed on Feb. 28, 2017, the contents of which are incorporated by reference herein in its entirety.

BACKGROUND

1. Technical Field

The present disclosure relates to a display device.

2. Description of the Related Art

Touch detection devices capable of detecting an external proximity object, what are called touch panels, have recently been attracting attention. Touch panels are mounted on or integrated with a display device, such as a liquid crystal display device, and used as display devices with a touch detection function (refer to U.S. Unexamined Patent Application Publication No. 2014/0049486, 2013/0342498, and 2014/0049508, for example). Some of the display devices have not only a touch detection function to detect contact of a finger of an operator with a screen but also a hover detection (proximity detection) function to detect a proximity state, a gesture, or the like of the finger not in contact with the screen.

The distance between detection electrodes and an object to be detected serving as a detection target, such as a finger, and the resolution required for detection significantly vary between touch detection and hover detection. If electrodes and a drive configuration for touch detection are used for hover detection without any change, it may possibly be difficult to perform accurate hover detection. To increase the detection sensitivity in hover detection, increasing the area of detection electrodes is effective. In this case, however, the detection accuracy for touch detection may possibly decrease.

SUMMARY

A display device according to an aspect of the present disclosure includes: a substrate; a plurality of detection electrodes provided in a display area of the substrate; a drive circuit configured to supply a drive signal to the detection electrodes; a detector configured to receive, from the detection electrodes, a detection signal corresponding to a capacitance change in the detection electrodes occurring when the drive signal is supplied; and a first switching circuit coupled to the detector via wiring and configured to change the number of detection electrodes electrically coupled to one of the wiring based on the detection signal.

DETAILED DESCRIPTION

Figure 1:
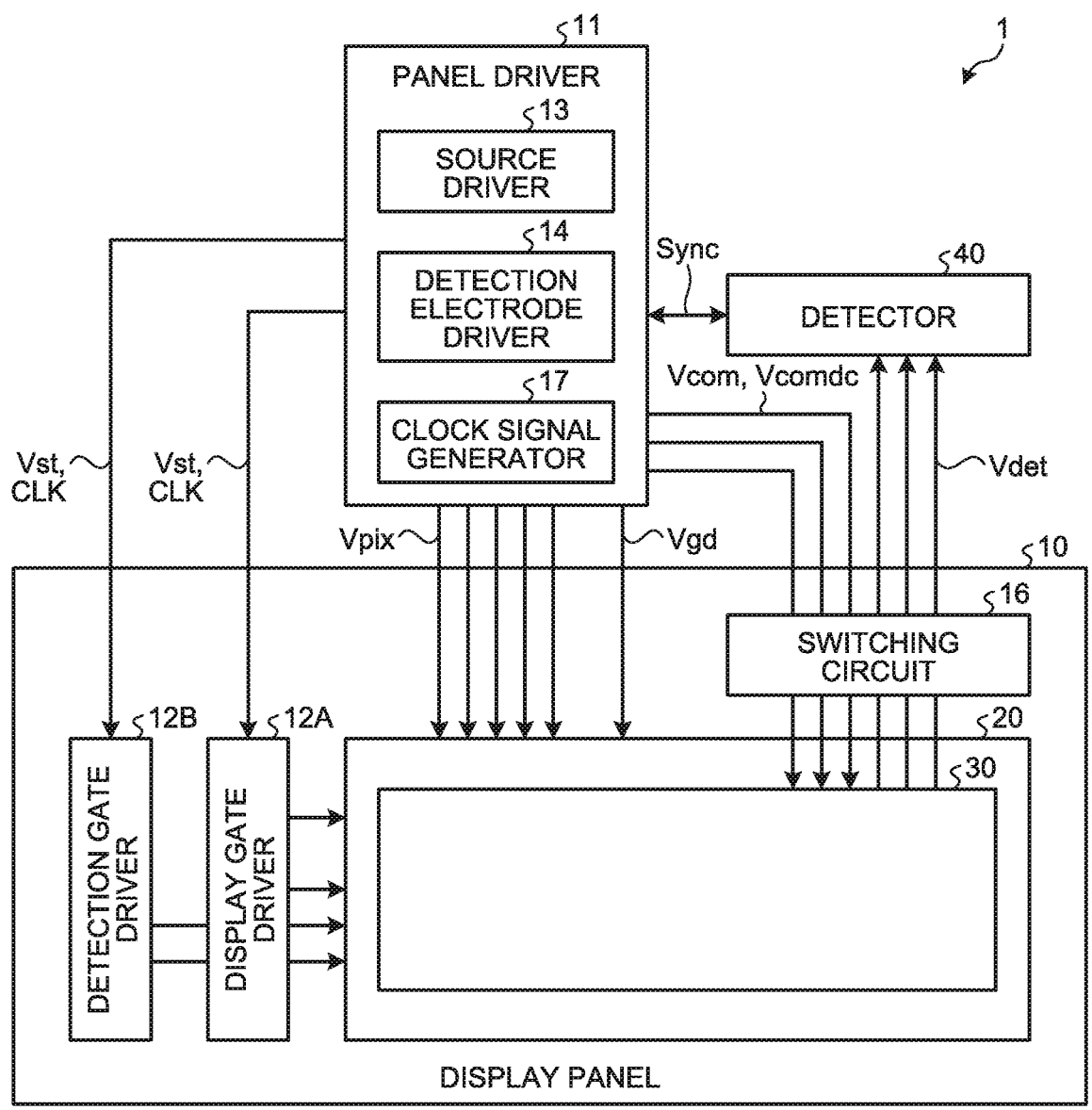
FIG. 1 is a block diagram of an exemplary configuration of a display device according to a first embodiment of the present disclosure.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the disclosure. In the present specification and the figures, components similar to those previously described with reference to previous figures are denoted by like reference numerals, and overlapping explanation thereof may be appropriately omitted.

First Embodiment

Figure 2:
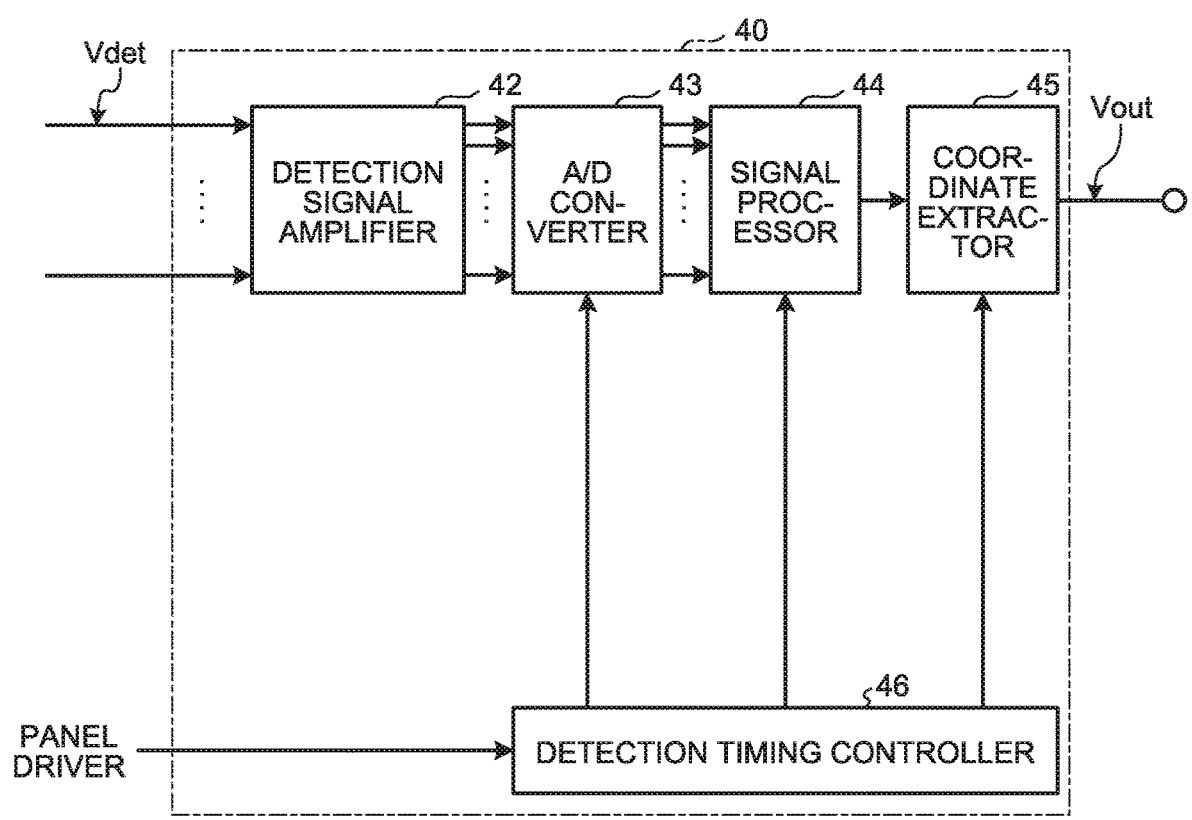
FIG. 2 is a block diagram of an exemplary configuration of a detector.

FIG. 1 is a block diagram of an exemplary configuration of a display device according to a first embodiment of the present disclosure. FIG. 2 is a block diagram of an exemplary configuration of a detector. As illustrated in FIG. 1, a display device 1 includes a display panel 10, a panel driver 11, and a detector 40. The display panel 10 includes a display unit 20 and a touch sensor 30. The display unit 20 displays an image. The touch sensor 30 is a detection device that detects touch input.

The display panel 10 is a display device in which the display unit 20 and the touch sensor 30 are integrated. Specifically, electrodes, substrates, and other components for the display unit 20 are also used for the touch sensor 30 in the display panel 10. The display panel 10 may be what is called an on-cell device in which the touch sensor 30 is mounted on the display unit 20. The display unit 20 may be an organic electroluminescence (EL) display panel, for example.

The display unit 20 includes a plurality of pixels including the display elements and has a display surface facing the pixels. The display unit 20 receives video signals to display an image composed of the pixels on the display surface.

The display panel 10 further includes a display gate driver 12A, a detection gate driver 12B, and a switching circuit 16. The display gate driver 12A has a function to sequentially select one horizontal line to be a target of display drive in the display unit 20 based on control signals supplied from the panel driver 11. The detection gate driver 12B has a function to sequentially or simultaneously select one horizontal line to be a target of detection drive in the touch sensor 30 based on control signals supplied from the panel driver 11.

The switching circuit 16 is provided between the touch sensor 30 and the detector 40. The switching circuit 16 switches between coupling and cutting off detection electrodes COML to be a target of detection drive to and from the detector 40 based on control signals supplied from the panel driver 11.

Part or all of the display gate driver 12A, the detection gate driver 12B, and the switching circuit 16 according to the present embodiment may be provided to a frame area 10b of a first substrate 21 (refer to FIG. 6), the panel driver 11, or an external processor, for example.

The panel driver 11 includes a source driver 13, a detection electrode driver 14, and a clock signal generator 17. The panel driver 11 is a circuit that supplies control signals to the display gate driver 12A, the detection gate driver 12B, the switching circuit 16, and the detector 40 based on video signals supplied from the outside to control a display operation and a detection operation. The panel driver 11 supplies synchronization signals Sync to the detector 40 and supplies clock signals CLK to the display gate driver 12A and the detection gate driver 12B. The panel driver 11 thus can control the various kinds of circuits such that they operate synchronously or asynchronously with one another.

The source driver 13 is a circuit that supplies pixel signals Vpix to respective sub-pixels SPix of the display unit 20. Part of the functions of the source driver 13 may be mounted on the display panel 10. In this case, the panel driver 11 may generate the pixel signals Vpix and supply them to the source driver 13.

The detection electrode driver 14 is a circuit that supplies display drive signals Vcomdc or detection drive signals Vcom to the detection electrodes COML of the display panel 10 via the switching circuit 16. The detection electrode driver 14 is a circuit that supplies guard signals Vgd to the detection electrodes COML in touch detection and hover detection.

The clock signal generator 17 is a circuit that generates start signals Vst and the clock signals CLK and supplies them to the display gate driver 12A and the detection gate driver 12B.

The touch sensor 30 has a function to detect the position of an object to be detected in contact with or in proximity to a display surface of the display panel 10 based on the basic principle of self-capacitance touch detection. If the display panel 10 detects contact or proximity of an object to be detected, the display panel 10 outputs detection signals Vdet to the detector 40.

The panel driver 11 according to the present embodiment has two detection modes, that is, touch detection (first detection mode) and hover detection (second detection mode) as detection modes performed by the touch sensor 30. In the present specification, touch detection indicates detecting the position of an object to be detected in a state where the object to be detected is in contact with the display surface or in proximity to the display surface close enough to consider it in contact therewith (hereinafter, referred to as a "contact state"). Hover detection indicates detecting the position and the movement of an object to be detected in a state where the object to be detected is neither in contact with the display surface nor in proximity to the display surface close enough to consider it in contact therewith (hereinafter, referred to as a "non-contact state"). A state where no object to be detected is present at a position facing the display surface or a state where an object to be detected is away from the display surface too far to be detected in hover detection is referred to as a "non-present state".

The switching circuit 16 switches between coupling and cutting off the detector 40 to and from the detection electrodes COML. In touch detection, the detection electrodes COML are individually coupled to the detector 40. In hover detection, a plurality of detection electrodes COML serving as a detection electrode block are collectively coupled to the detector 40. The detection signals Vdet output from the detection electrodes COML are supplied to the detector 40 via the switching circuit 16.

The detector 40 is a circuit that determines whether a touch is made by the object to be detected on the display surface of the display panel 10 based on the control signals supplied from the panel driver 11 and on the detection signals Vdet output from the display panel 10 in self-capacitance touch detection. If a touch is detected, the detector 40 calculates coordinates at which the touch input is performed, for example.

As illustrated in FIG. 2, the detector 40 includes a detection signal amplifier 42, an analog/digital (A/D) converter 43, a signal processor 44, a coordinate extractor 45, and a detection timing controller 46. The detection timing controller 46 performs control such that the detection signal amplifier 42, the A/D converter 43, the signal processor 44, and the coordinate extractor 45 operate synchronously with one another based on the control signals supplied from the panel driver 11.

The detection signal amplifier 42 amplifies the detection signals Vdet supplied from the display panel 10. The A/D converter 43 samples analog signals output from the detection signal amplifier 42 at a timing synchronized with the drive signals Vcom, thereby converting the analog signals into digital signals.

The signal processor 44 is a logic circuit that determines whether a touch is made on the display panel 10 based on the output signals from the A/D converter 43. The signal processor 44 performs processing of extracting a signal (absolute value $|\Delta V|$) of the difference between the detection signals caused by a finger. The signal processor 44 compares the absolute value $|\Delta V|$ with a predetermined threshold voltage. If the absolute value $|\Delta V|$ is lower than the threshold voltage, the signal processor 44 determines that the object to be detected is in the non-present state. By contrast, if the absolute value $|\Delta V|$ is equal to or higher than the threshold voltage, the signal processor 44 determines that the object to be detected is in the contact state or a proximity state. The detector 40 thus can perform touch detection.

The coordinate extractor 45 is a logic circuit that calculates, when the signal processor 44 detects a touch, the touch panel coordinates of the touch. The coordinate extractor 45 outputs the touch panel coordinates as output signals Vout. The coordinate extractor 45 may output the output signals Vout to the panel driver 11. The panel driver 11 can perform a predetermined display operation or a predetermined detection operation based on the output signals Vout.

The detection signal amplifier 42, the A/D converter 43, the signal processor 44, the coordinate extractor 45, and the detection timing controller 46 of the detector 40 are provided to the display device 1. The configuration is not limited thereto, and all or part of the functions of the detector 40 may be provided to an external processor, for example. The coordinate extractor 45, for example, may be provided to an external processor separately from the display device 1. The detector 40 may output the signals processed by the signal processor 44 as output signals Vout.

Figure 3:
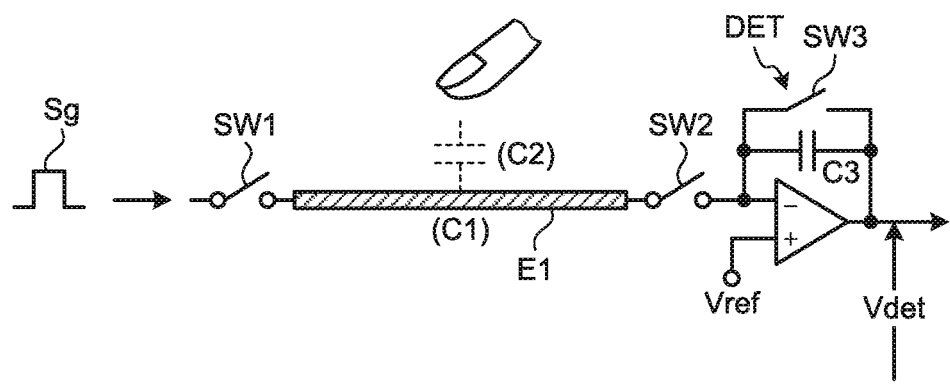
FIG. 3 is a diagram for explaining the basic principle of self-capacitance touch detection.
Figure 4:
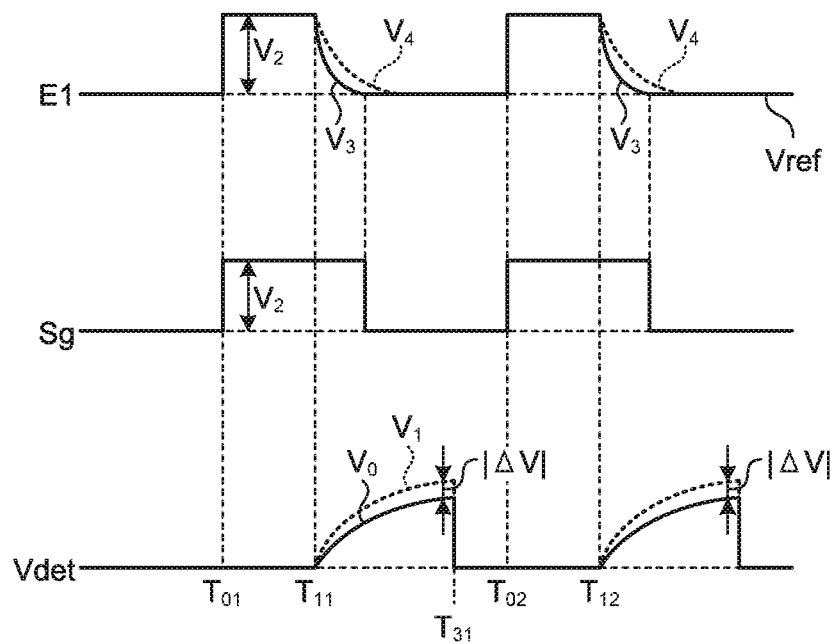
FIG. 4 is a diagram of an example of waveforms of a drive signal and a detection signal in self-capacitance touch detection.

The display panel 10 performs touch control based on the basic principle of capacitance touch detection. The following describes the basic principle of self-capacitance touch detection performed by the display panel 10 according to the present embodiment with reference to FIGS. 3 and 4. FIG. 3 is a diagram for explaining the basic principle of self-capacitance touch detection. FIG. 4 is a diagram of an example of waveforms of a drive signal and a detection signal in self-capacitance touch detection. FIG. 3 also illustrates a detection circuit.

In the non-present state, an AC rectangular wave Sg at a predetermined frequency (e.g., several kilohertz to several hundred kilohertz) is applied to a detection electrode E1. The detection electrode E1 has capacitance C1, and an electric current depending on the capacitance C1 flows. The voltage detector DET converts fluctuations in the electric current depending on the AC rectangular wave Sg into fluctuations in the voltage (waveform $V_0$ indicated by the solid line (refer to FIG. 4)).

As illustrated in FIG. 3, in the contact state, capacitance C2 between a finger and the detection electrode E1 is added to the capacitance C1 of the detection electrode E1. When the AC rectangular wave Sg is applied to the detection electrode E1, an electric current depending on the capacitance C1 and the capacitance C2 flows. As illustrated in FIG. 4, the voltage detector DET converts fluctuations in the electric current depending on the AC rectangular wave Sg into fluctuations in the voltage (waveform $V_1$ indicated by the dotted line). The voltage detector DET detects contact of the finger based on the absolute value $|\Delta V|$ of the difference between the waveform $V_0$ and the waveform $V_1$.

Specifically, in FIG. 4, the voltage level of the AC rectangular wave Sg rises by an amount corresponding to voltage $V_2$ at time $T_{01}$. At this time, the switch SW1 is turned on, and the switch SW2 is turned off. As a result, the electric potential of the detection electrode E1 also rises to voltage $V_2$. Subsequently, the switch SW1 is turned off before time $T_{11}$. While the detection electrode E1 is in a floating state at this time, the electric potential of the detection electrode E1 is maintained at $V_2$ by the capacitance C1 (or C1+C2, refer to FIG. 3) of the detection electrode E1. Subsequently, the voltage detector DET performs a reset operation before time $T_{11}$.

Subsequently, when the switch SW2 is turned on at time $T_{11}$, the electric charge accumulated in the capacitance C1 (or C1+C2) of the detection electrode E1 moves to capacitance C3 in the voltage detector DET. As a result, output from the voltage detector DET increases (refer to the detection signal Vdet in FIG. 4). In the non-present state, the output (detection signal Vdet) from the voltage detector DET corresponds to the waveform $V_0$ indicated by the solid line, and Vdet=C1×$V_2$/C3 is satisfied. In the contact state, the output corresponds to the waveform $V_1$ indicated by the dotted line, and Vdet=(C1+C2)×$V_2$/C3 is satisfied.

Subsequently, at time $T_{31}$, the switch SW2 is turned off, and the switch SW1 and a switch SW3 are turned on. As a result, the electric potential of the detection electrode E1 is reduced to a low level equal to the electric potential of the AC rectangular wave Sg, and the voltage detector DET is reset. The operation described above is repeated at a predetermined frequency (e.g., several kilohertz to several hundred kilohertz). The detector 40 thus can perform touch detection based on the basic principle of self-capacitance touch detection.

Figure 5:
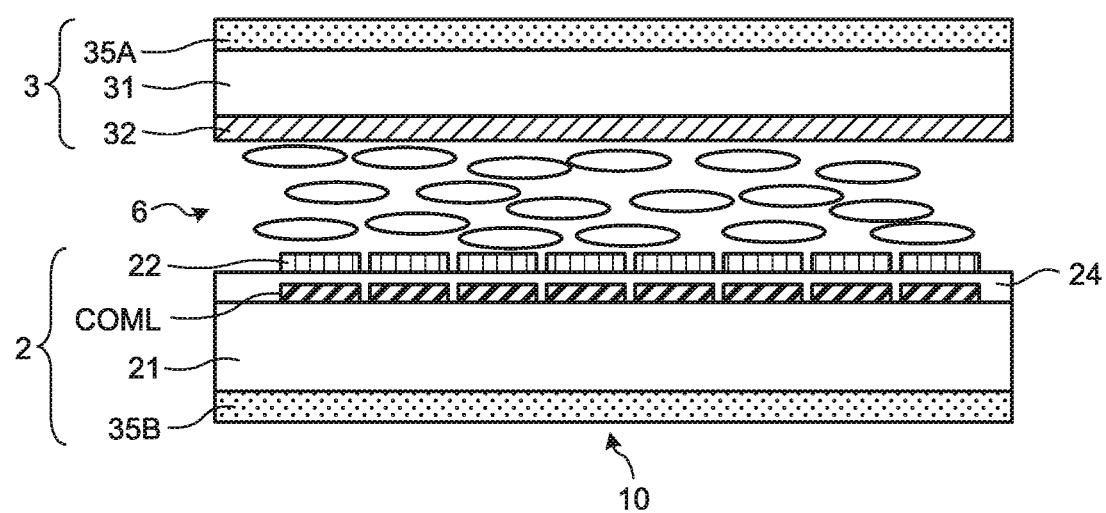
FIG. 5 is a sectional view of a schematic sectional structure of the display device according to the first embodiment.

The following describes an exemplary configuration of the display device 1 according to the present embodiment in greater detail. FIG. 5 is a sectional view of a schematic sectional structure of the display device according to the first embodiment. As illustrated in FIG. 5, the display panel 10 includes an array substrate 2, a counter substrate 3, and a liquid crystal layer 6 serving as a display functional layer. The counter substrate 3 is disposed facing the array substrate 2 in a direction perpendicular to the surface of the array substrate 2. The liquid crystal layer 6 is provided between the array substrate 2 and the counter substrate 3.

The array substrate 2 includes a first substrate 21, pixel electrodes 22, the detection electrodes COML, an insulating layer 24, and a polarization plate 35B. The first substrate 21 is provided with circuits, such as gate scanners included in the display gate driver 12A or the detection gate driver 12B, switching elements, such as thin film transistors (TFT), and various kinds of wiring, such as display gate lines GCL and display signal lines SGL (not illustrated in FIG. 5).

The detection electrodes COML are provided on the first substrate 21. The pixel electrodes 22 are provided above the detection electrodes COML with the insulating layer 24 interposed therebetween and disposed in a matrix (row-column configuration) in planar view. The pixel electrodes 22 are provided corresponding to the respective sub-pixels SPix constituting each pixel Pix in the display panel 10. The pixel electrodes 22 are supplied with the pixel signals Vpix for performing a display operation. The detection electrodes COML are supplied with the direct-current (DC) display drive signals Vcomdc in the display operation to serve as common electrodes for a plurality of pixel electrodes 22. The polarization plate 35B is provided below the first substrate 21.

The pixel electrodes 22 and the detection electrodes COML according to the present embodiment are made of a translucent conductive material, such as indium tin oxide (ITO).

In the present specification, "above" indicates a direction from the first substrate 21 toward a second substrate 31 in the direction perpendicular to the first substrate 21, and "below" indicates a direction from the second substrate 31 toward the first substrate 21. The "planar view" indicates a view seen in the direction perpendicular to the surface of the first substrate 21.

The array of the pixel electrodes 22 is not limited to a matrix array in which the pixel electrodes 22 are arrayed in a first direction and a second direction orthogonal to the first direction. Alternatively, adjacent pixel electrodes 22 may be disposed deviating in the first direction or the second direction. Still alternatively, facing pixel electrodes 22 may have different sizes, and two or three pixel electrodes 22 may be disposed on one side of one pixel electrode 22 included in a pixel column arrayed in the first direction.

The counter substrate 3 includes the second substrate 31, a color filter 32, and a polarizing plate 35A. The color filter 32 is provided to a first surface of the second substrate 31. The polarizing plate 35A is provided to a second surface of the second substrate 31. The color filter 32 faces the liquid crystal layer 6 in the direction perpendicular to the first substrate 21. The color filter 32 may be disposed on the first substrate 21. The first substrate 21 and the second substrate 31 according to the present embodiment are glass substrates or resin substrates, for example.

The first substrate 21 and the second substrate 31 are disposed facing each other with a predetermined space interposed therebetween. The liquid crystal layer 6 is provided between the first substrate 21 and the second substrate 31. In the liquid crystal layer 6, the orientation state of liquid crystal molecules changes depending on the state of an electric field formed across the layer. The liquid crystal layer 6 thus modulates the light passing therethrough. The display device 1 employs a lateral electric-field mode, such as the in-plane switching (IPS) mode including the fringe-field switching (FFS) mode, as the electric-field mode. Orientation films (not illustrated in FIG. 5) are provided on the outermost surface of the array substrate 2 and the outermost surface of the counter substrate 3 that are facing the liquid crystal layer 6 illustrated in FIG. 5. The orientation films determine the initial orientation state of the liquid crystal molecules.

An illuminator (backlight), which is not illustrated, is provided below the first substrate 21. The illuminator includes a light source, such as light emitting diodes (LED), and outputs light from the light source to the first substrate 21. The light from the illuminator passes through the array substrate 2 and is modulated depending on the orientation state of the liquid crystal molecules at the corresponding position in the liquid crystal layer. As a result, the state of transmission of light to the display surface varies in each of the pixel electrodes, that is, each of the pixels. With this mechanism, an image is displayed on the display surface.

Figure 6:
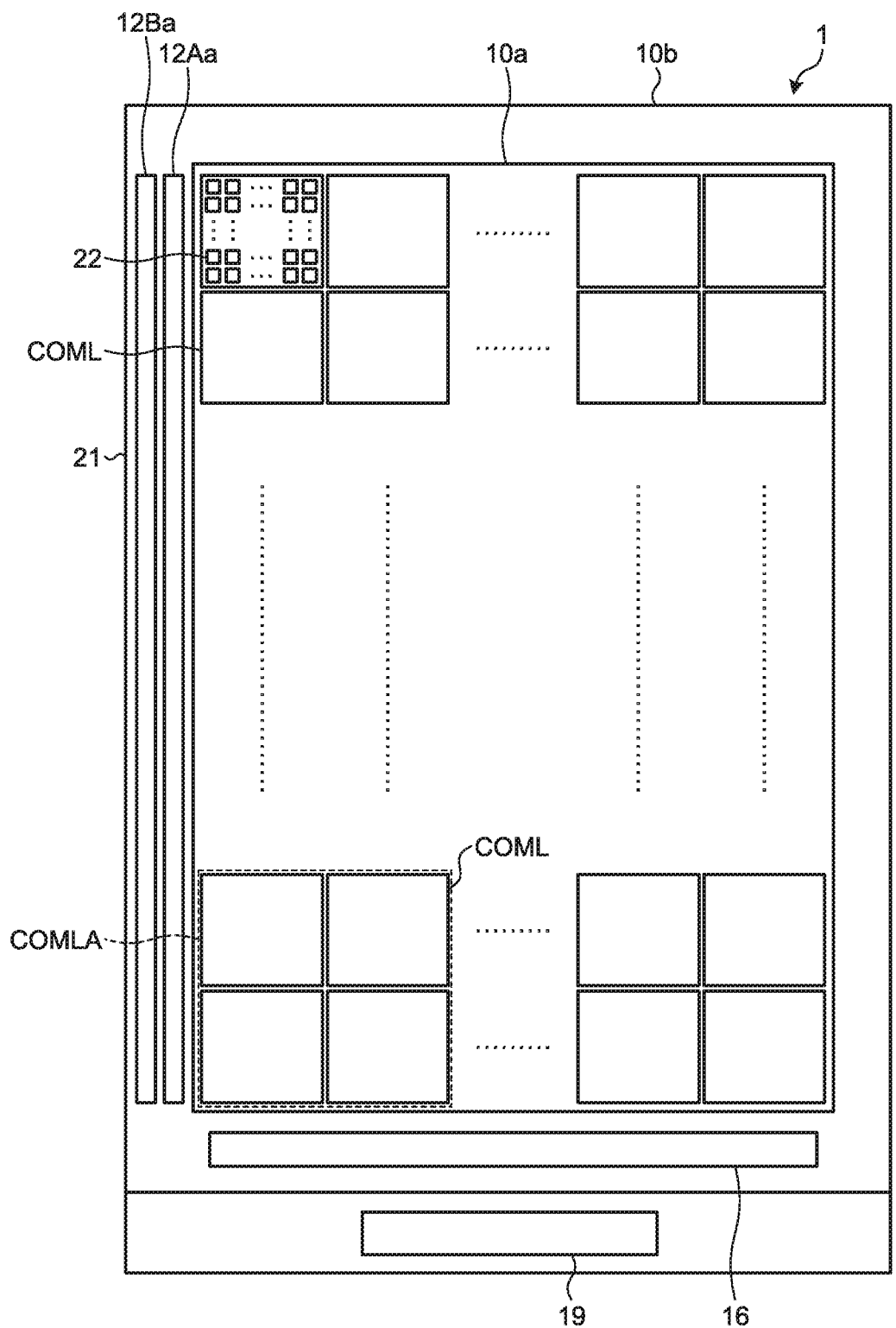
FIG. 6 is a plan view schematically illustrating a first substrate included in the display device.

FIG. 6 is a plan view schematically illustrating the first substrate included in the display device. As illustrated in FIG. 6, the frame area 10b is positioned outside a display area 10a in the display device 1. In the present specification, the display area 10a is an area for displaying an image and provided with a plurality of pixels Pix (sub-pixels SPix). The frame area 10b is a frame-like area surrounding the display area 10a. The frame area 10b is positioned on the inner side than the outer periphery of the first substrate 21 and on the outer side than the display area 10a.

As illustrated in FIG. 6, a plurality of detection electrodes COML are provided in a matrix (row-column configuration) in the display area 10a. In other words, the detection electrodes COML are arrayed along the long side of the display area 10a and the short side of the display area 10a.

A plurality of pixel electrodes 22 are disposed in a matrix (row-column configuration) at a position corresponding to one detection electrode COML. The pixel electrode 22 has an area smaller than that of the detection electrode COML. While part of the detection electrodes COML and the pixel electrodes 22 are illustrated in FIG. 6, they are disposed over the whole display area 10a.

Shift registers 12Aa and 12Ba are provided on the long side of the frame area 10b. The shift register 12Aa is a circuit included in the display gate driver 12A and has a function to select a display gate line GCL. The shift register 12Ba is a circuit included in the detection gate driver 12B and has a function to select a first gate line for detection GCLT1 and a second gate line for detection GCLT2.

The switching circuit 16 and a display integrated circuit (IC) 19 are provided on the short side of the frame area 10b. The display IC 19 also serves as the panel driver 11 illustrated in FIG. 1. Part of the functions of the detector 40 may be included in the display IC 19 or provided as functions of an external micro-processing unit (MPU). The display IC 19 does not necessarily have the configuration described above and may be provided to a control substrate outside the module, for example. The detector 40 may be provided as another IC separately from the display IC 19, and these ICs may be coupled to the electrodes, such as the detection electrodes COML, via wiring.

In touch detection, the panel driver 11 according to the present embodiment drives each of the detection electrodes COML. The detector 40 receives the detection signals Vdet corresponding to capacitance changes in the respective detection electrodes COML based on the basic principle of self-capacitance touch detection described above. The detector 40 detects touch input based on the detection signals Vdet output individually from the detection electrodes COML. The display device 1 performs touch detection on each of the detection electrodes COML in the display area 10a. Consequently, the coordinate extractor 45 can detect the position of an object to be detected in the contact state.

By contrast, in hover detection, the panel driver 11 simultaneously and collectively drives a detection electrode block COMLA including a plurality of detection electrodes COML. The detection electrode block COMLA includes a plurality of detection electrodes COML arrayed in the row direction and the column direction. The detector 40 can perform hover detection based on the detection signals Vdet output collectively from one detection electrode block COMLA. The detection electrode block COMLA thus serves as one detection electrode. The display device 1 performs hover detection on each of the detection electrode blocks COMLA in the display area 10a. Consequently, the coordinate extractor 45 can detect the position and the movement, such as a gesture, of an object to be detected in the non-contact state.

The detection electrode block COMLA has an area larger than that of the individual detection electrode COML in touch detection. With this configuration, the lines of electric force of an electric field generated from the detection electrode block COMLA reach a position away from the display surface. Consequently, the display device 1 can perform accurate touch detection and satisfactory hover detection while using the detection electrodes COML both in touch detection and hover detection.

In the example illustrated in FIG. 6, one detection electrode block COMLA includes four detection electrodes COML. The configuration is not limited thereto, and one detection electrode block COMLA may include five or more detection electrodes COML. One detection electrode block COMLA may include all the detection electrodes COML in the display area 10a, for example.

Figure 7:
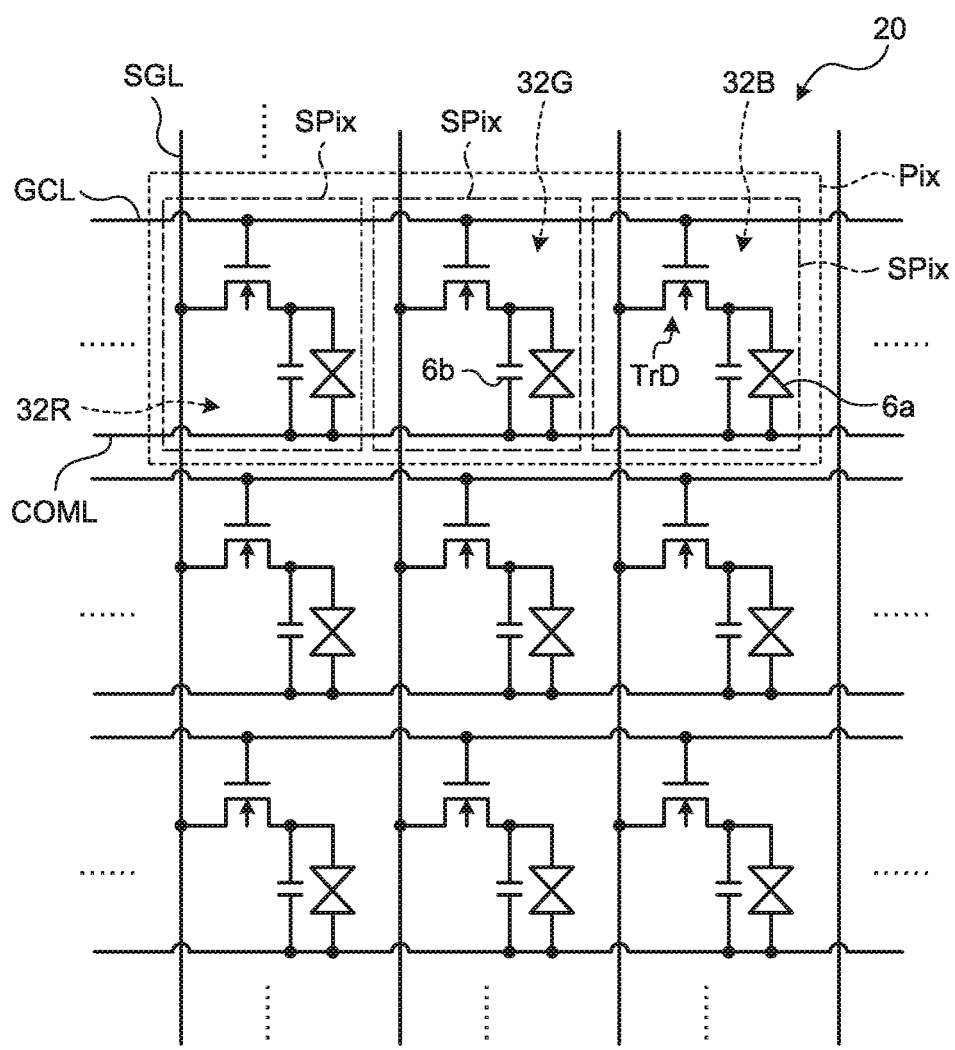
FIG. 7 is a circuit diagram of a pixel array in a display unit according to the first embodiment.

The following describes a display operation performed by the display panel 10. FIG. 7 is a circuit diagram of a pixel array in the display unit according to the first embodiment. The first substrate 21 (refer to FIG. 5) is provided with display switching elements TrD of the respective sub-pixels SPix, the display signal lines SGL, the display gate lines GCL, and other components as illustrated in FIG. 7. The display signal lines SGL are wiring that supplies the pixel signals Vpix to the pixel electrodes 22. The display gate lines GCL are wiring that supplies drive signals for driving the display switching elements TrD. The display signal lines SGL and the display gate lines GCL extend on a plane parallel to the surface of the first substrate 21.

The display unit 20 illustrated in FIG. 7 includes a plurality of sub-pixels SPix arrayed in a matrix (row-column configuration). The sub-pixels SPix each include the display switching element TrD and a liquid crystal element 6a. The display switching element TrD is a thin-film transistor and is an n-channel metal oxide semiconductor (MOS) TFT in this example. The insulating layer 24 is provided between the pixel electrodes 22 and the common electrodes (detection electrodes COML) to form holding capacitance 6b illustrated in FIG. 7.

The display gate driver 12A illustrated in FIG. 1 sequentially selects the display gate line GCL. The display gate driver 12A applies scanning signals Vscan to the gates of the display switching elements TrD of the respective sub-pixels SPix via the selected display gate line GCL. As a result, one row (one horizontal line) out of the sub-pixels SPix is sequentially selected as a target of display drive. The source driver 13 supplies the pixel signals Vpix to the sub-pixels SPix included in the selected one horizontal line via the display signal lines SGL. The sub-pixels SPix perform display on each horizontal line based on the supplied pixel signals Vpix.

To perform the display operation, the detection electrode driver 14 applies the display drive signals Vcomdc to the detection electrodes COML. As a result, the detection electrodes COML serve as common electrodes for the pixel electrodes 22 in the display operation. To perform display, the detection electrode driver 14 applies the drive signals Vcomdc to all the detection electrodes COML in the display area 10a.

The color filter 32 illustrated in FIG. 5 may include periodically arrayed color areas of the color filter in three colors of red (R), green (G), and blue (B), for example. Color areas 32R, 32G, and 32B in the three colors of R, G, and B, respectively, serve as a set and correspond to the respective sub-pixels SPix illustrated in FIG. 7. A pixel Pix is composed of a set of sub-pixels SPix corresponding to the respective color areas 32R, 32G, and 32B in the three colors. The color filter 32 may include color areas in four or more colors.

Figure 8:
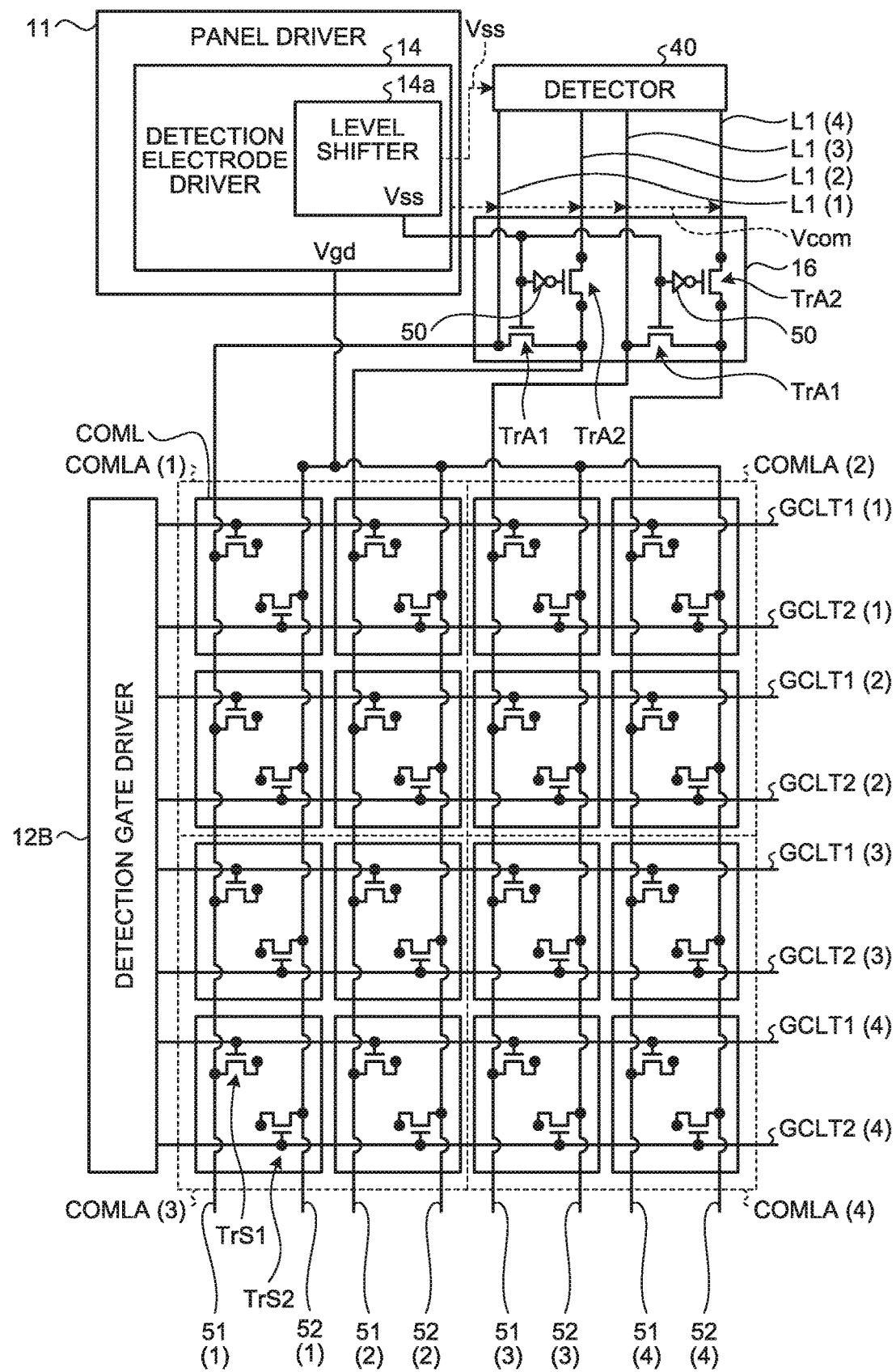
FIG. 8 is a circuit diagram for explaining the coupling configuration of detection electrodes according to the first embodiment.

The following describes a detection operation performed by the touch sensor 30 according to the present embodiment. FIG. 8 is a circuit diagram for explaining the coupling configuration of the detection electrodes according to the first embodiment. To simplify the explanation, FIG. 8 illustrates the detection electrodes COML in four rows and four columns. The configuration is not limited thereto, and the detection electrodes COML may be provided in five or more rows and in five or more columns. The number of detection electrodes COML arrayed in the row direction may be different from that of detection electrodes COML arrayed in the column direction.

As illustrated in FIG. 8, first gate lines for detection GCLT1(1), GCLT1(2), GCLT1(3), and GCLT1(4) and second gate lines for detection GCLT2(1), GCLT2(2), GCLT2(3), and GCLT2(4) are provided under the detection electrodes COML arrayed in the row direction. The first gate line GCLT1(1) and the second gate line GCLT2(1) are provided corresponding to the detection electrodes COML in the first row. The first gate line GCLT1(2) and the second gate line GCLT2(2) are provided corresponding to the detection electrodes COML in the second row. The first gate line GCLT1(3) and the second gate line GCLT2(3) are provided corresponding to the detection electrodes COML in the third row. The first gate line GCLT1(4) and the second gate line GCLT2(4) are provided corresponding to the detection electrodes COML in the fourth row.

In the following description, the first gate lines GCLT1(1), GCLT1(2), GCLT1(3), and GCLT1(4) are referred to as the first gate lines GCLT1 when they need not be distinguished from one another. The second gate lines GCLT2(1), GCLT2(2), GCLT2(3), and GCLT2(4) are referred to as the second gate lines GCLT2 when they need not be distinguished from one another.

As illustrated in FIG. 8, the first gate lines GCLT1 and the second gate lines GCLT2 extend in the row direction and are arrayed in the column direction. One first gate line GCLT1 is provided under the detection electrodes COML arrayed in the row direction and coupled to first switching elements TrS1 corresponding to the respective detection electrodes COML. One second gate line GCLT2 is provided under the detection electrodes COML arrayed in the row direction and coupled to second switching elements TrS2 corresponding to the respective detection electrodes COML. One detection electrode COML is provided with one first gate line GCLT1 and one second gate line GCLT2. The first gate lines GCLT1 and the second gate lines GCLT2 are coupled to the detection gate driver 12B.

As illustrated in FIG. 8, first signal lines for detection 51(1), 51(2), 51(3), and 51(4) and second signal lines for detection 52(1), 52(2), 52(3), and 52(4) are provided under the detection electrodes COML arrayed in the column direction. The first signal line 51(1) and the second signal line 52(1) are provided corresponding to the detection electrodes COML in the first column. The first signal line 51(2) and the second signal line 52(2) are provided corresponding to the detection electrodes COML in the second column. The first signal line 51(3) and the second signal line 52(3) are provided corresponding to the detection electrodes COML in the third column. The first signal line 51(4) and the second signal line 52(4) are provided corresponding to the detection electrodes COML in the fourth column.

In the following description, the first signal lines 51(1), 51(2), 51(3), and 51(4) are referred to as the first signal lines 51 when they need not be distinguished from one another. The second signal lines 52(1), 52(2), 52(3), and 52(4) are referred to as the second signal lines 52 when they need not be distinguished from one another. The first signal lines 51 and the second signal lines 52 extend in the column direction and are arrayed in the row direction. In other words, the first signal lines 51 and the second signal lines 52 intersect the first gate lines GCLT1 and the second gate lines GCLT2 in planar view.

One first signal line 51 is provided under the detection electrodes COML arrayed in the column direction and coupled to the first switching elements TrS1 corresponding to the respective detection electrodes COML. One second signal line 52 is provided under the detection electrodes COML arrayed in the column direction and coupled to the second switching elements TrS2 corresponding to the respective detection electrodes COML. One detection electrode COML is provided with one first signal line 51 and one second signal line 52. The first signal lines 51 are coupled to the switching circuit 16. The second signal lines 52 are coupled to the panel driver 11. The first signal lines 51 and the second signal lines 52 are made of a metal material including at least one of aluminum (Al), copper (Cu), silver (Ag), molybdenum (Mo), and an alloy of these metals.

The first switching elements for detection TrS1 and the second switching elements for detection TrS2 are provided corresponding to the respective detection electrodes COML. The first switching elements TrS1 and the second switching elements TrS2 are n-channel MOS TFTs, for example.

The first switching element TrS1 is provided at an intersection of the first gate line GCLT1 and the first signal line 51. The first switching element TrS1 switches between coupling and cutting off the first signal line 51 to and from the detection electrode COML. The detection gate driver 12B supplies a first scanning signal Vscan1 to the first switching element TrS1. When the first scanning signal Vscan1 is at a high level potential, the first switching element TrS1 is turned on, and the first signal line 51 is coupled to the detection electrode COML. When the first scanning signal Vscan1 is at a low level potential, the first switching element TrS1 is turned off, and the first signal line 51 is cut off from the detection electrode COML.

The second switching element TrS2 is provided at an intersection of the second gate line GCLT2 and the second signal line 52. The second switching element TrS2 switches between coupling and cutting off the second signal line 52 to and from the detection electrode COML. The detection gate driver 12B supplies a second scanning signal Vscan2 to the second switching element TrS2. When the second scanning signal Vscan2 is at a high level potential, the second switching element TrS2 is turned on, and the second signal line 52 is coupled to the detection electrode COML. When the second scanning signal Vscan2 is at a low level potential, the second switching element TrS2 is turned off, and the second signal line 52 is cut off from the detection electrode COML.

The first scanning signal Vscan1 and the second scanning signal Vscan2 are voltage signals having opposite polarities. In other words, when the first scanning signal Vscan1 is at a high level, the second scanning signal Vscan2 is at a low level. When the first scanning signal Vscan1 is at a low level, the second scanning signal Vscan2 is at a high level.

With this configuration, the first switching element TrS1 and the second switching element TrS2 perform opposite switching operations. In other words, when the first switching element TrS1 is turned on, the second switching element TrS2 is turned off. When the first switching element TrS1 is turned off, the second switching element TrS2 is turned on. With the switching operations, the detection electrode COML is coupled to one of the first signal line 51 and the second signal line 52 and cut off from the other thereof in the same period.

As illustrated in FIG. 8, the detector 40 is coupled to the switching circuit 16 via wires L1(1), L1(2), L1(3), and L1(4). The wires L1(1), L1(2), L1(3), and L1(4) are provided corresponding to the first signal lines 51(1), 51(2), 51(3), and 51(4), respectively. In the following description, the wires L1(1), L1(2), L1(3), and L1(4) are simply referred to as wires L1 when they need not be distinguished from one another.

The detection electrode driver 14 supplies the drive signals Vcom to the detection electrodes COML via the wires L1, the switching circuit 16, and the first signal lines 51. The detection signals Vdet corresponding to capacitance changes in the respective detection electrodes COML are supplied to the detector 40 via the first signal lines 51, the switching circuit 16, and the wires L1 based on the basic principle of self-capacitance touch detection described above. Part of the detection electrodes COML in which the first switching element TrS1 is turned on and that are electrically coupled to the first signal lines 51 serve as detection electrodes. The other part of the detection electrodes COML in which the first switching element TrS1 is turned off and that are not electrically coupled to the first signal lines 51 do not serve as detection electrodes.

As described above, the detection electrodes COML not serving as detection electrodes are electrically coupled to the second signal lines 52 via the respective second switching elements TrS2. The detection electrode driver 14 supplies the guard signals Vgd to the detection electrodes COML not serving as detection electrodes via the second signal lines 52. The guard signal Vgd is a voltage signal synchronized with the drive signal Vcom and having the same electric potential as that of the drive signal Vcom. The detection electrodes COML coupled to the second signal lines 52 are driven at the same electric potential as that of the detection electrodes COML coupled to the first signal lines 51. This mechanism can reduce stray capacitance in the detection electrodes COML, thereby improving the detection accuracy. As described above, the detection electrodes COML electrically coupled to the second signal lines 52 out of the detection electrodes COML serve as guard electrodes.

The detection electrode driver 14 of the panel driver 11 includes a level shifter 14a. The level shifter 14a is a circuit that switches between a high-level voltage signal and a low-level voltage signal to generate a sensor coupling signal Vss. The sensor coupling signal Vss is a signal for changing the number of collectively driven detection electrodes COML between touch detection and hover detection. The level shifter 14a outputs the sensor coupling signal Vss to the switching circuit 16 and the detector 40.

The switching circuit 16 includes third switching elements TrA1, fourth switching elements TrA2, and inverters 50. The third switching elements TrA1 and the fourth switching elements TrA2 are n-channel MOS TFTs, for example.

The third switching element TrA1 switches between coupling and cutting off two first signal lines 51. In the example illustrated in FIG. 8, the third switching elements TrA1 are provided between the first signal lines 51(1) and 51(2) and between the first signal lines 51(3) and 51(4).

The fourth switching element TrA2 is coupled to one of the first signal lines 51 coupled to one third switching element TrA1. The fourth switching element TrA2 switches between coupling and cutting off the first signal line 51 to and from the wire L1. In the example illustrated in FIG. 8, the fourth switching elements TrA2 are provided between the first signal line 51(2) and the wire L1(2) and between the first signal line 51(4) and the wire L1(4).

The level shifter 14a supplies the sensor coupling signal Vss to the third switching elements TrA1. Simultaneously, the level shifter 14a supplies the sensor coupling signal Vss to the fourth switching elements TrA2 via the inverters 50. The inverter 50 is an inverting circuit that inverts the polarity of a received signal and outputs it. In other words, if the inverter 50 receives the sensor coupling signal Vss at a high level, the inverter 50 outputs a low-level voltage signal. If the inverter 50 receives the sensor coupling signal Vss at a low level, the inverter 50 outputs a high-level voltage signal.

In touch detection, the level shifter 14a supplies the sensor coupling signal Vss at a low level to the switching circuit 16. As a result, the third switching elements TrA1 are turned off. Consequently, the first signal line 51(1) is cut off from the first signal line 51(2), and the first signal line 51(3) is cut off from the first signal line 51(4). By contrast, the fourth switching elements TrA2 are turned on. Consequently, the first signal line 51(2) is coupled to the wire L1(2), and the first signal line 51(4) is coupled to the wire L1(4). Neither the third switching element TrA1 nor the fourth switching element TrA2 is provided between the first signal line 51(1) and the wire L1(1) and between the first signal line 51(3) and the wire L1(3). Consequently, the first signal line 51(1) is coupled to the wire L1(1), and the first signal line 51(3) is coupled to the wire L1(3). As described above, one first signal line 51 is electrically coupled to one wire L1.

The detection gate driver 12B sequentially selects the first gate line GCLT1. The first switching elements TrS1 corresponding to the selected first gate line GCLT1 are turned on, whereby the detection electrodes COML are coupled to the first signal lines 51. In other words, in touch detection, one detection electrode COML is electrically coupled to one wire L1 in a time division manner.

The detection electrode driver 14 supplies the drive signals Vcom to the detection electrodes COML individually via the first signal lines 51. The detection signals Vdet are supplied from the respective detection electrodes COML to the detector 40 via the first signal lines 51 and the wires L1. With this configuration, the detector 40 can detect touch input made by an object to be detected with detection accuracy corresponding to the array pitch of the detection electrodes COML.

In hover detection, the level shifter 14a supplies the sensor coupling signal Vss at a high level to the switching circuit 16. As a result, the third switching elements TrA1 are turned on. Consequently, the first signal line 51(1) is coupled to the first signal line 51(2), and the first signal line 51(3) is coupled to the first signal line 51(4). By contrast, the fourth switching elements TrA2 are turned off. Consequently, the first signal line 51(2) is cut off from the wire L1(2), and the first signal line 51(4) is cut off from the wire L1(4).

As a result, the first signal lines 51(1) and 51(2) are coupled to the wire L1(1), and the first signal lines 51(3) and 51(4) are coupled to the wire L1(3). In other words, two first signal lines 51 are electrically coupled to one wire L1. A plurality of detection electrodes COML arrayed in the row direction are electrically coupled to one wire L1 via a plurality of first signal lines 51. The detection electrode driver 14 supplies the drive signals Vcom to the detection electrodes COML via the wire L1. The detection signals Vdet corresponding to capacitance changes in the respective detection electrodes COML are collectively supplied to the detector 40 via the wire L1.

The panel driver 11 supplies control signals to the detection gate driver 12B based on the detection signals Vdet. The detection gate driver 12B changes the number of first gate lines GCLT1 simultaneously supplied with the first scanning signals Vscan1. In other words, the detection gate driver 12B selects a plurality of first gate lines GCLT1 simultaneously. As a result, the detection electrode driver 14 supplies the drive signals Vcom to a plurality of detection electrodes COML arrayed in the column direction via the wires L1 and the first signal lines 51. The detection signals Vdet are collectively supplied from the detection electrodes COML arrayed in the column direction to the detector 40 via the wires L1.

If the detection gate driver 12B selects the first gate lines GCLT1(1) and GCLT1(2) simultaneously, for example, the detection electrode driver 14 supplies the drive signals Vcom to the detection electrodes COML included in a detection electrode block COMLA(1). The detection signals Vdet corresponding to capacitance changes in the detection electrode block COMLA(1) are supplied to the detector 40 via the first signal lines 51(1) and 51(2) and the wire L1(1). At the same time, the detection electrode driver 14 supplies the drive signals Vcom to the detection electrodes COML included in a detection electrode block COMLA(2) via the first signal lines 51(3) and 51(4). The detection signals Vdet corresponding to capacitance changes in the detection electrode block COMLA(2) are supplied to the detector 40 via the first signal lines 51(3) and 51(4) and the wire L1(3).

Similarly, if the detection gate driver 12B selects the first gate lines GCLT1(3) and GCLT1(4) simultaneously, the detection electrode driver 14 supplies the drive signals Vcom to detection electrode blocks COMLA(3) and COMLA(4). The detection signals Vdet corresponding to capacitance changes in the detection electrode blocks COMLA(3) and COMLA(4) are supplied to the detector 40 via the wires L1(1) and L1(3), respectively.

As described above, the switching circuit 16 can change the number of detection electrodes COML coupled to one wire L1 between touch detection and hover detection based on the sensor coupling signal Vss. In hover detection, the switching circuit 16 couples the detection electrode block COMLA including a plurality of detection electrodes COML to one wire L1. As a result, the detection electrode block COMLA is collectively driven, thereby serving as one detection electrode. This mechanism can make the area of the detection electrode COML in hover detection substantially larger than that of the individual detection electrode COML in touch detection. Consequently, the display device 1 can detect hover input made by an object to be detected with high detection sensitivity while using the detection electrodes COML both in touch detection and hover detection.

While two first signal lines 51 are coupled to one wire L1 in the description above, the configuration is not limited thereto. In hover detection, for example, three or more first signal lines 51 may be coupled to one wire L1.

Figure 9:
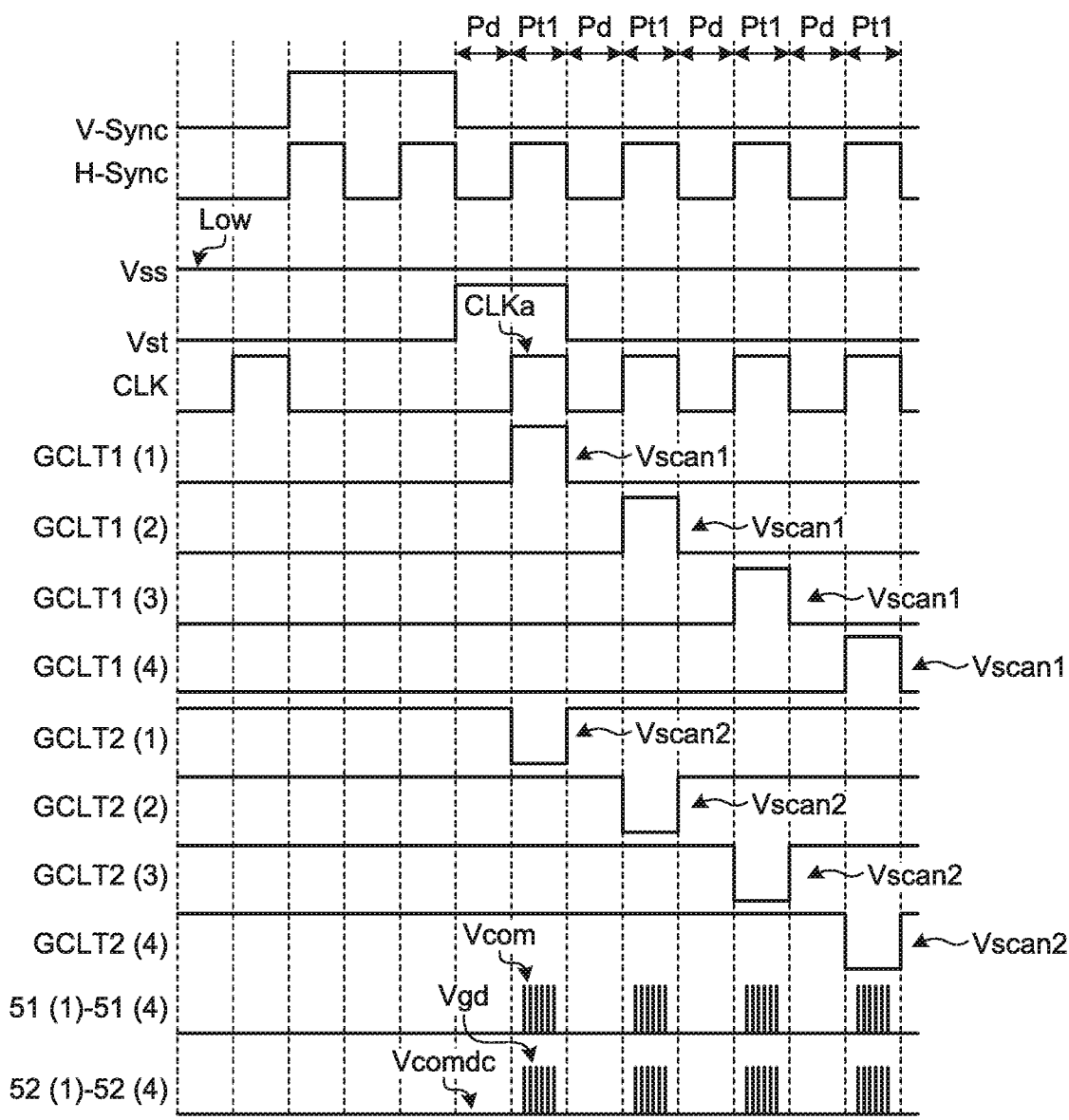
FIG. 9 is a timing waveform chart of an exemplary operation in touch detection performed by the display device according to the first embodiment.
Figure 10:
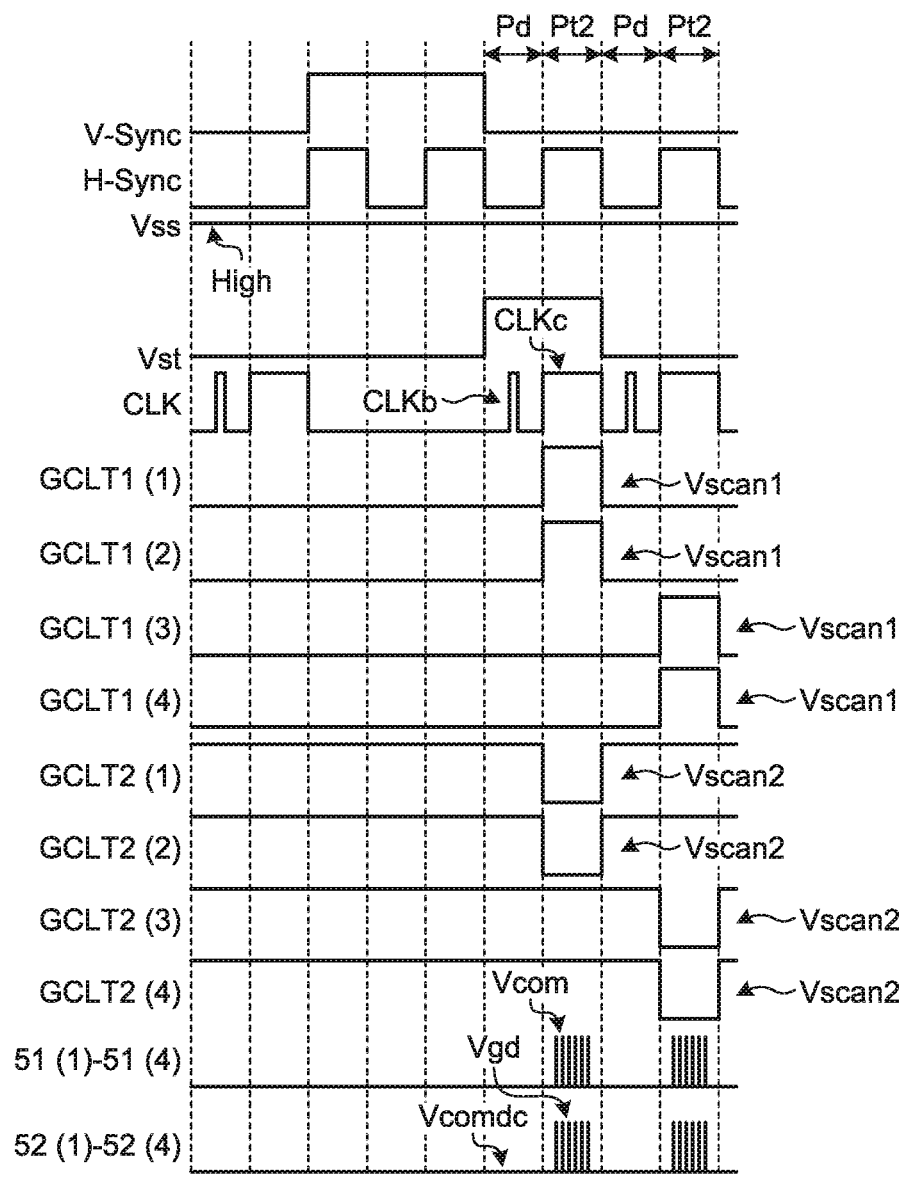
FIG. 10 is a timing waveform chart of an exemplary operation in hover detection performed by the display device according to the first embodiment.

The following describes an example of the driving method according to the present embodiment with reference to FIG. 1 and FIGS. 8 to 10. FIG. 9 is a timing waveform chart of an exemplary operation in touch detection performed by the display device according to the first embodiment. FIG. 10 is a timing waveform chart of an exemplary operation in hover detection performed by the display device according to the first embodiment. As illustrated in FIG. 9, a display period Pd and a touch detection period Pt1 are alternately arranged in a time division manner.

The panel driver 11 supplies a vertical synchronization signal V-Sync and a horizontal synchronization signal H-Sync to the display panel 10 and the detector 40. When the vertical synchronization signal V-Sync is turned on (high level), the display panel 10 displays an image of one frame. The horizontal synchronization signal H-Sync is a control signal for switching between the display period Pd and the touch detection period Pt1 or between the display period Pd and a hover detection period Pt2. When the horizontal synchronization signal H-Sync is turned on (high level), touch detection is performed. When the horizontal synchronization signal H-Sync is turned off (low level), display is performed. As a result, display and detection are performed in a time division manner.

When the vertical synchronization signal V-Sync is turned on, the panel driver 11 supplies the start signal Vst and the clock signal CLK to the display gate driver 12A and the detection gate driver 12B. When the start signal Vst is turned on, the display panel 10 starts display and detection. The clock signal CLK is a voltage signal synchronized with the horizontal synchronization signal H-Sync. When the clock signal CLK is turned on (high level), touch detection is performed. When the clock signal CLK is turned off (low level), display is performed.

In the display periods Pd, the first scanning signal Vscan1 is turned off, and the second scanning signal Vscan2 is turned on. As a result, the first switching elements TrS1 are turned off, whereby the first signal lines 51 are cut off from the detection electrodes COML. By contrast, the second switching elements TrS2 are turned on, whereby the second signal lines 52 are coupled to the detection electrodes COML. In the display periods Pd, the detection electrode driver 14 supplies the display drive signals Vcomdc to the detection electrodes COML via the second signal lines 52.

If one pulse CLKa of the clock signal CLK is present in a period of one pulse of the start signal Vst as illustrated in FIG. 9, the display panel 10 performs touch detection. If two pulses of the clock signal CLK, that is, a first pulse CLKb and a second pulse CLKc are present in a period of one pulse of the start signal Vst as illustrated in FIG. 10, the display panel 10 performs hover detection. In the example illustrated in FIG. 10, the first pulse CLKb has a pulse width smaller than that of the second pulse CLKc and is generated in a period when the horizontal synchronization signal H-Sync is off. The second pulse CLKc is synchronized with the horizontal synchronization signal H-Sync. Hover detection is performed in a period when the second pulse CLKc is on.

As illustrated in FIG. 9, the sensor coupling signal Vss is a low-level (low) voltage signal in touch detection. The third switching elements TrA1 of the switching circuit 16 are turned off, and the fourth switching elements TrA2 are turned on.

As illustrated in FIG. 9, the detection gate driver 12B supplies the first scanning signal Vscan1 at a high level to the first gate line GCLT1(1) in the touch detection period Pt1. The first switching elements TrS1 corresponding to the first gate line GCLT1(1) are turned on. As a result, the detection electrodes COML corresponding to the first gate line GCLT1(1) are coupled to the first signal lines 51.

The detection electrode driver 14 supplies the drive signals Vcom to the detection electrodes COML corresponding to the first gate line GCLT1(1) via the first signal lines 51(1) to 51(4). The detection signals Vdet are supplied from the respective detection electrodes COML to the detector 40 via the first signal lines 51(1) to 51(4).

In the same period, the detection gate driver 12B supplies the second scanning signals Vscan2 at a high level to the second gate lines GCLT2(2) to GCLT2(4). The second switching elements TrS2 corresponding to the second gate lines GCLT2(2) to GCLT2(4) are turned on. As a result, the detection electrodes COML corresponding to the second gate lines GCLT2(2) to GCLT2(4) are coupled to the second signal lines 52.

The detection electrode driver 14 supplies the guard signals Vgd to the detection electrodes COML corresponding to the second gate lines GCLT2(2) to GCLT2(4) via the second signal lines 52(1) to 52(4). As a result, the detection electrodes COML not selected as a detection target are driven in synchronization with and having the same electric potential as that of the detection electrodes COML selected as a detection target. This mechanism suppresses capacitive coupling between the detection electrodes COML and reduces stray capacitance. Consequently, the present embodiment can increase the detection accuracy of the display panel 10 in touch detection.

Similarly, the detection gate driver 12B sequentially supplies the first scanning signals Vscan1 at a high level to the first gate lines GCLT1(2), GCLT1(3), and GCLT1(4) in the respective touch detection periods Pt1. As a result, the drive signals Vcom are sequentially supplied to the detection electrodes COML in the display area 10a. The display device 1 thus can detect the position of an object to be detected in the contact state based on the detection signals Vdet output from the respective detection electrodes COML.

The detection gate driver 12B sequentially supplies the second scanning signals Vscan2 at a low level to the second gate lines GCLT2(2), GCLT2(3), and GCLT2(4) in the respective touch detection periods Pt1. As a result, the guard signals Vgd are supplied to all the non-detection target detection electrodes COML not selected as a detection target in the respective touch detection periods Pt1.

As illustrated in FIG. 10, the display period Pd and the hover detection period Pt2 are alternately arranged in a time division manner. The display operation in the display period Pd is performed in the same manner as that in the example above.

As illustrated in FIG. 10, the sensor coupling signal Vss is a high-level (high) voltage signal in hover detection. As a result, the third switching elements TrA1 of the switching circuit 16 are turned on, and the fourth switching elements TrA2 are turned off.

In the hover detection period Pt2, the detection gate driver 12B changes the number of first gate lines GCLT1 simultaneously supplied with the first scanning signals Vscan1 based on the detection signals Vdet. Specifically, the detection gate driver 12B supplies the first scanning signals Vscan1 at a high level to the first gate lines GCLT1(1) and GCLT1(2). The first switching elements TrS1 corresponding to the first gate lines GCLT1(1) and GCLT1(2) are turned on. As a result, the detection electrode blocks COMLA(1) and COMLA(2) are coupled to the first signal lines 51.

The detection electrode driver 14 supplies the drive signals Vcom to the detection electrode block COMLA(1) via the first signal lines 51(1) and 51(2). Simultaneously, the detection electrode driver 14 supplies the drive signals Vcom to the detection electrode block COMLA(2) via the first signal lines 51(3) and 51(4). The detection signals Vdet are supplied from the detection electrode blocks COMLA(1) and COMLA(2) to the switching circuit 16 via the first signal lines 51(1) to 51(4).

As described above, the first signal lines 51(1) and 51(2) are coupled to the wire L1(1), and the first signal lines 51(3) and 51(4) are coupled to the wire L1(3) in the switching circuit 16. With this configuration, the detection signals Vdet from the detection electrode block COMLA(1) are supplied to the detector 40 via the wire L1(1), and the detection signals Vdet from the detection electrode block COMLA(2) are supplied to the detector 40 via the wire L1(3).

In the same period, the detection gate driver 12B supplies the second scanning signals Vscan2 at a high level to the second gate lines GCLT2(3) and GCLT2(4). The second switching elements TrS2 corresponding to the second gate lines GCLT2(3) and GCLT2(4) are turned on. As a result, the detection electrode blocks COMLA(3) and COMLA(4) are coupled to the second signal lines 52.

The detection electrode driver 14 supplies the guard signals Vgd to the detection electrode blocks COMLA(3) and COMLA(4) via the second signal lines 52(1) to 52(4). The detection electrodes COML in the detection electrode blocks COMLA(3) and COMLA(4) not selected as a detection target are driven in synchronization with and having the same electric potential as that of the detection electrodes COML in the detection electrode blocks COMLA(1) and COMLA(2) selected as a detection target. This mechanism suppresses capacitive coupling between the detection electrodes COML and reduces stray capacitance. Consequently, the present embodiment can increase the detection accuracy of the display panel 10 in hover detection.

Similarly, in the next hover detection period Pt2, the detection gate driver 12B supplies the first scanning signals Vscan1 at a high level to the first gate lines GCLT1(3) and GCLT1(4). The detection electrode driver 14 supplies the drive signals Vcom to the detection electrode block COMLA(3) corresponding to the first gate lines GCLT1(3) and GCLT1(4) via the first signal lines 51(1) and 51(2). Simultaneously, the detection electrode driver 14 supplies the drive signals Vcom to the detection electrode block COMLA(4) via the first signal lines 51(3) and 51(4).

The detection signals Vdet are supplied from the detection electrode blocks COMLA(3) and COMLA(4) to the switching circuit 16 via the first signal lines 51(1) to 51(4). The detection signals Vdet from the detection electrode block COMLA(3) are supplied to the detector 40 via the wire L1(1), and the detection signals Vdet from the detection electrode block COMLA(4) are supplied to the detector 40 via the wire L1(3). As described above, the display device 1 performs hover detection using the detection electrode blocks COMLA in the display area 10a. Consequently, the display device 1 can detect the position and the movement, such as a gesture, of an object to be detected in the non-contact state.

The detection gate driver 12B supplies the second scanning signals Vscan2 at a high level to the second gate lines GCLT2(1) and GCLT2(2). The detection electrode driver 14 supplies the guard signals Vgd to the detection electrode blocks COMLA(1) and COMLA(2) corresponding to the second gate lines GCLT2(1) and GCLT2(2) via the second signal lines 52(1) to 52(4). As a result, the detection electrodes COML in the detection electrode blocks COMLA(1) and COMLA(2) not selected as a detection target serve as guard electrodes.

The timing waveform charts illustrated in FIGS. 9 and 10 are given by way of example only and may be appropriately modified. The display device 1, for example, may sequentially perform detection on the detection electrodes COML in a plurality of rows in one touch detection period Pt1. In other words, the detection gate driver 12B may sequentially supply the first scanning signals Vscan1 to a plurality of first gate lines GCLT1 in one touch detection period Pt1. The display device 1 may sequentially perform detection on the detection electrode blocks COMLA in a plurality of rows in one hover detection period Pt2. Alternatively, the display device 1 may collectively drive all the detection electrodes COML in the display area 10a as one detection electrode block COMLA to perform hover detection in one hover detection period Pt2.

Figure 11:
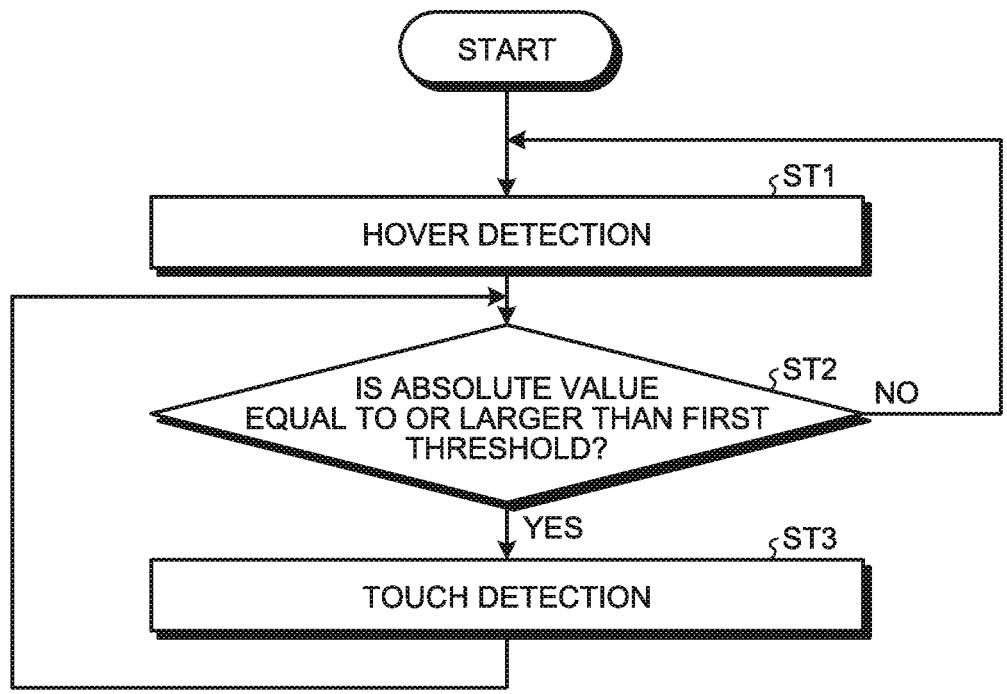
FIG. 11 is a flowchart of an exemplary operation performed by the display device according to the first embodiment.
Figure 12:
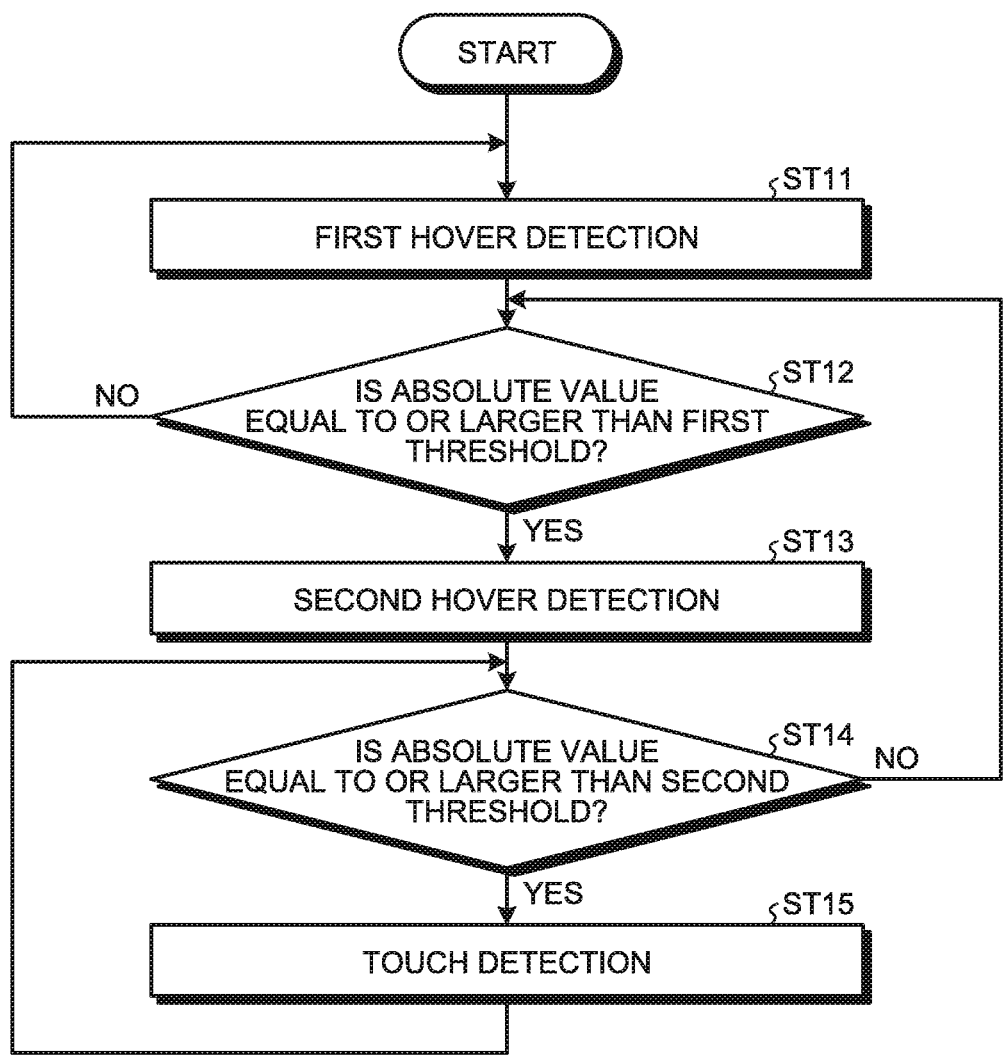
FIG. 12 is a flowchart of another exemplary operation performed by the display device according to the first embodiment.
Figure 13:
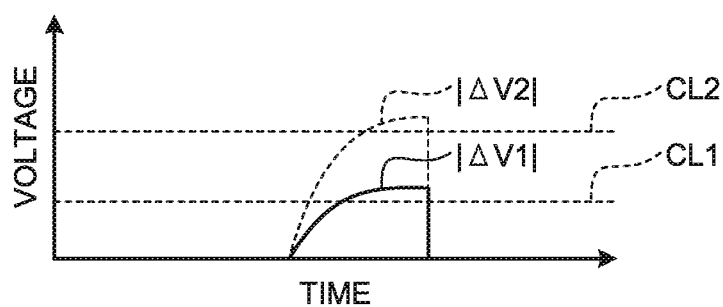
FIG. 13 is a graph schematically illustrating the relation between a detection signal and a threshold.
Figure 14:
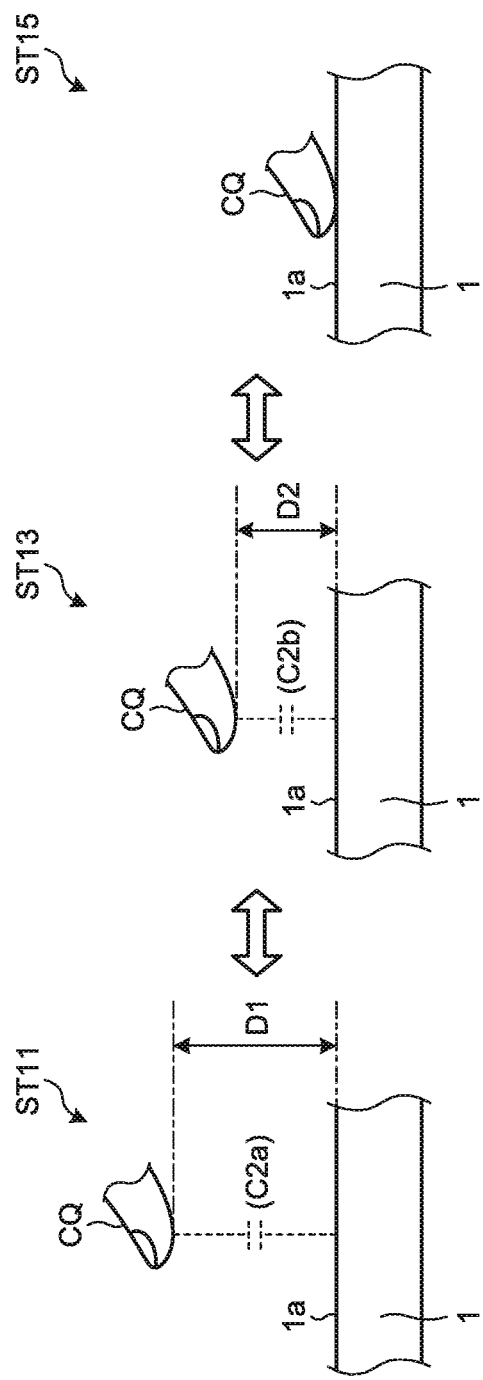
FIG. 14 is a diagram for explaining the relation between the display device and an object to be detected in touch detection and hover detection.

The following describes a switching operation between touch detection and hover detection. FIG. 11 is a flowchart of an exemplary operation performed by the display device according to the first embodiment. FIG. 12 is a flowchart of another exemplary operation performed by the display device according to the first embodiment. FIG. 13 is a graph schematically illustrating the relation between a detection signal and a threshold. FIG. 14 is a diagram for explaining the relation between the display device and an object to be detected in touch detection and hover detection.

As illustrated in FIG. 13, the signal processor 44 (refer to FIG. 2) of the detector 40 compares a signal (absolute value $|\Delta V|$) of the difference between the detection signals Vdet with predetermined thresholds CL1 and CL2. The signal processor 44 thus determines whether an object to be detected is in the contact state or the non-contact state with respect to the display surface. The panel driver 11 switches between touch detection and hover detection based on the information from the signal processor 44.

As illustrated in FIG. 11, the panel driver 11 performs hover detection first (Step ST1). Specifically, the panel driver 11 supplies the sensor coupling signal Vss at a high level to the switching circuit 16. As a result, the display device 1 detects an object to be detected in the non-contact state on each detection electrode block COMLA including four detection electrodes COML, for example.

As illustrated in FIG. 13, the signal processor 44 determines whether an absolute value |ΔV1| is equal to or larger than the predetermined threshold CL1 (Step ST2). If the absolute value |ΔV1| is smaller than the predetermined threshold CL1 (No at Step ST2), the signal processor 44 determines that the object to be detected is in the non-contact state, and the panel driver 11 continues the hover detection. If the absolute value |ΔV1| is equal to or larger than the predetermined threshold CL1 (Yes at Step ST2), the signal processor 44 determines that the object to be detected is in the contact state, and the panel driver 11 performs touch detection (Step ST3). Specifically, the panel driver 11 supplies the sensor coupling signal Vss at a low level to the switching circuit 16. As a result, the display device 1 detects the object to be detected in the contact state on each detection electrode COML, for example.

If the absolute value |ΔV1| is equal to or larger than the predetermined threshold CL1 (Yes at Step ST2), the panel driver 11 continues the touch detection. If the absolute value |ΔV1| is smaller than the predetermined threshold CL1 (No at Step ST2), the panel driver 11 switches from touch detection to hover detection (Step ST1) and performs a detection operation.

The switching operation between touch detection and hover detection is not limited to the example illustrated in FIG. 11. As illustrated in FIG. 12, for example, the panel driver 11 performs first hover detection first (Step ST11). In the first hover detection, for example, the switching circuit 16 couples all the detection electrodes COML to one wire L1. The detection electrode driver 14 supplies the drive signals Vcom to the detection electrode block COMLA including all the detection electrodes COML in the display area 10a. The detector 40 detects an object to be detected in the non-contact state based on the detection signals Vdet supplied from the detection electrode block COMLA including all the detection electrodes COML.

As illustrated in FIG. 14, an object to be detected CQ is in the non-contact state with respect to a display surface 1a of the display device 1 in the first hover detection (Step ST11). The object to be detected CQ is away from the display surface 1a by a distance D1. Capacitance C2a is generated between the object to be detected CQ and the detection electrode COML (not illustrated).

As illustrated in FIG. 12, the signal processor 44 determines whether the absolute value |ΔV1| is equal to or larger than the predetermined threshold CL1 (Step ST12). If the absolute value |ΔV1| is smaller than the predetermined threshold CL1 (No at Step ST12), the signal processor 44 determines that the object to be detected is away from the display surface, and the panel driver 11 continues the first hover detection. If the absolute value |ΔV1| is equal to or larger than the predetermined threshold CL1 (Yes at Step ST12), the signal processor 44 determines that the object to be detected is closer to the display surface, and the panel driver 11 performs second hover detection (Step ST13). In the second hover detection, the panel driver 11 detects the object to be detected in the non-contact state on each detection electrode block COMLA including four detection electrodes COML, for example.

As illustrated in FIG. 14, the object to be detected CQ is in the non-contact state with respect to the display surface 1a of the display device 1 in the second hover detection (Step ST13) but closer to the display surface 1a than in the first hover detection. The object to be detected CQ is away from the display surface 1a by a distance D2. The distance D2 is smaller than the distance D1. Capacitance C2b is generated between the object to be detected CQ and the detection electrode COML (not illustrated). The capacitance C2b is larger than the capacitance C2a.

The signal processor 44 determines whether an absolute value |ΔV2| is equal to or larger than the predetermined threshold CL2 (Step ST14). If the absolute value |ΔV2| is smaller than the predetermined threshold CL2 (No at Step ST14), the signal processor 44 determines that the object to be detected is in the non-contact state, and the panel driver 11 continues the second hover detection or the first hover detection.

If the absolute value |ΔV2| is equal to or larger than the predetermined threshold CL2 (Yes at Step ST14), the signal processor 44 determines that the object to be detected is in the contact state, and the panel driver 11 performs touch detection (Step ST15).

As illustrated in FIG. 14, the object to be detected CQ is in the contact state with respect to the display surface 1a of the display device 1 in touch detection (Step ST15). Capacitance generated between the object to be detected CQ and the detection electrode COML (not illustrated) is larger than the capacitance C2a. Consequently, the absolute value |ΔV2| is larger than the absolute value |ΔV1|.

While all the detection electrodes COML are collectively driven in the first hover detection illustrated in FIG. 12, the configuration is not limited thereto. The panel driver 11 may switch between the first hover detection and the second hover detection while changing the number of detection electrodes COML included in the detection electrode block. With this configuration, the display device 1 can perform hover detection with appropriate detection accuracy depending on the distance between the display surface and the object to be detected.

Figure 15:
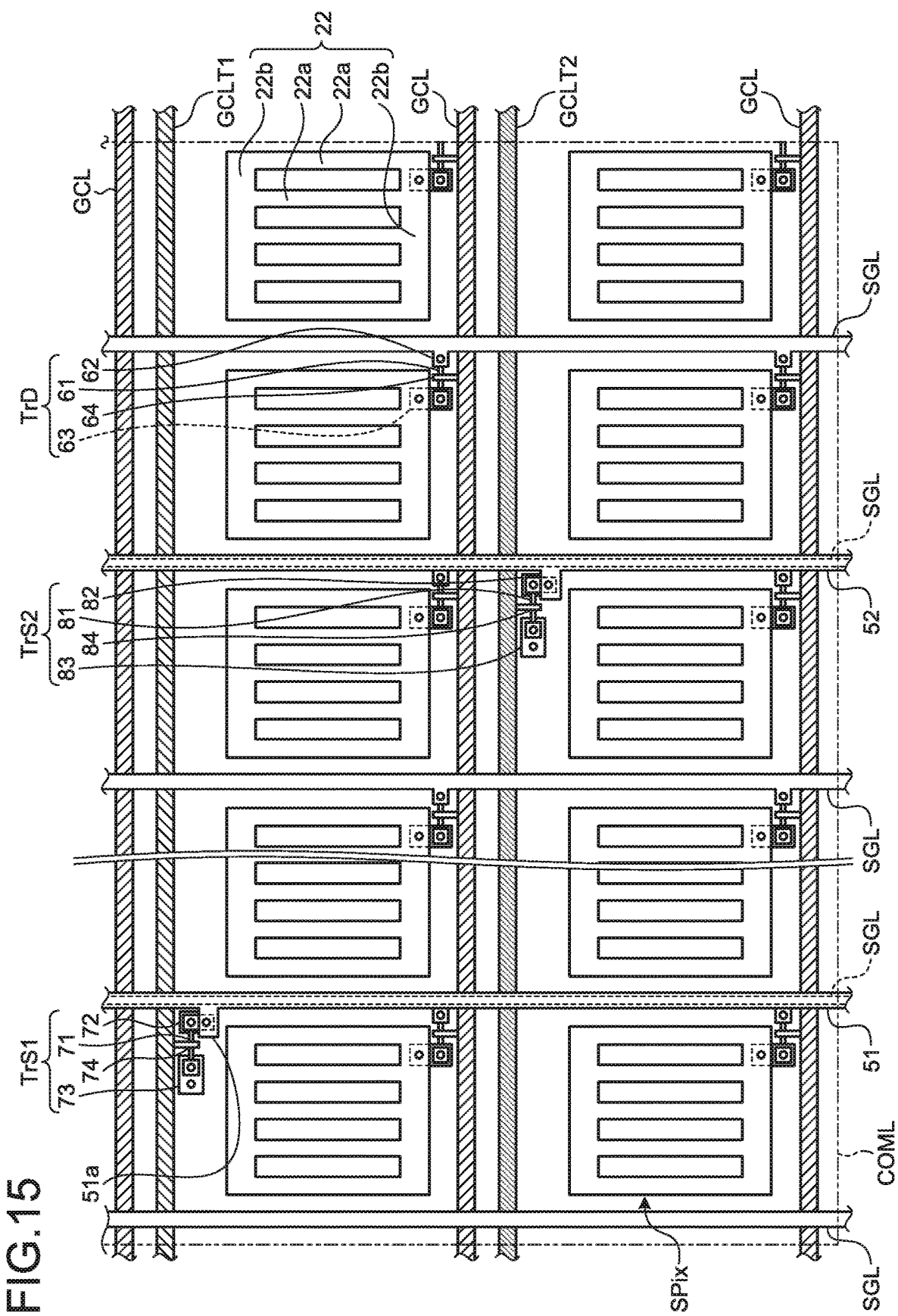
FIG. 15 is a plan view for explaining the configuration of detection electrodes and pixel electrodes according to a second embodiment of the present disclosure.
Figure 16:
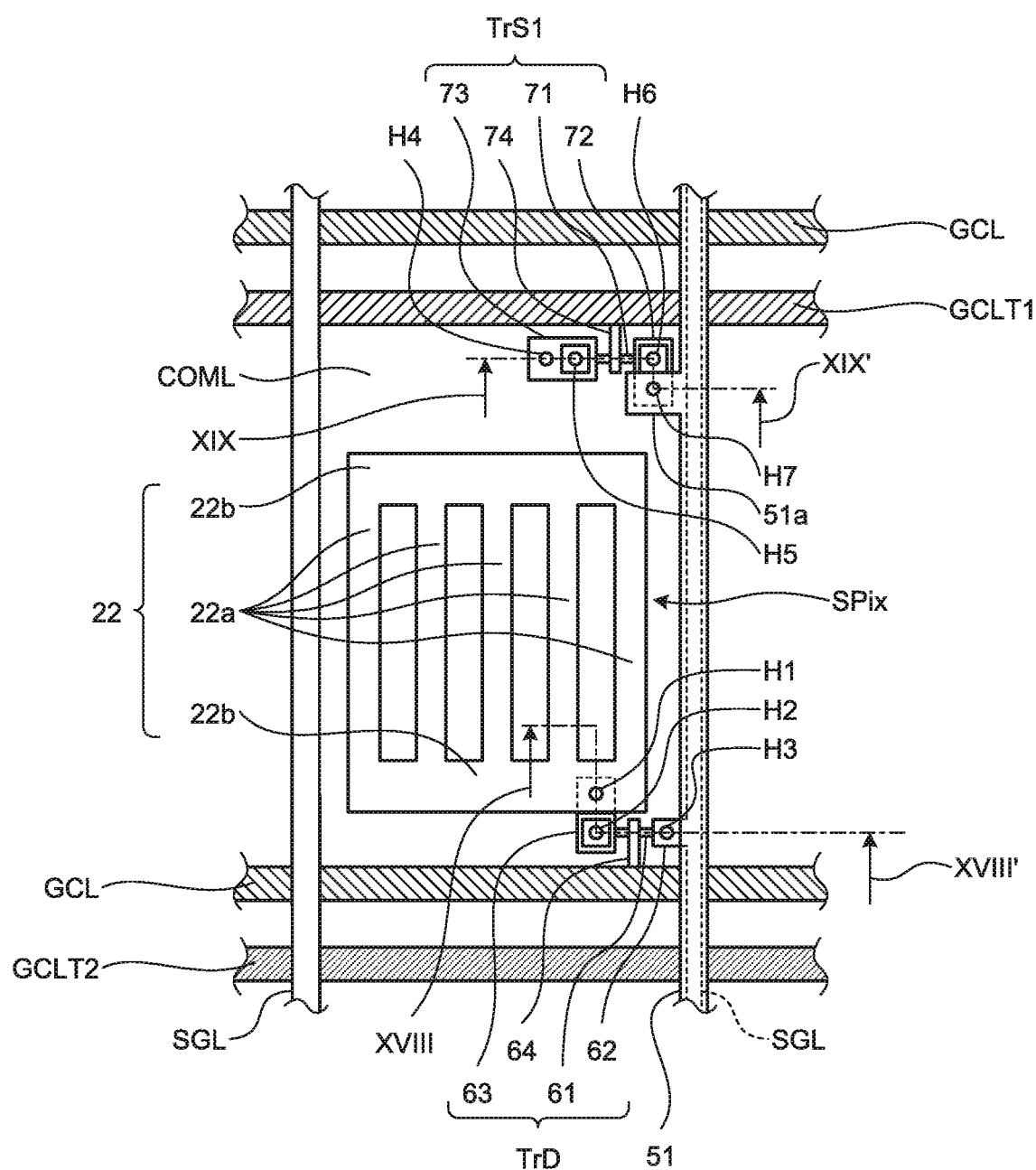
FIG. 16 is a plan view of a sub-pixel for explaining the coupling configuration between the detection electrode and a first signal line and the coupling configuration between the pixel electrode and a display signal line according to the first embodiment.
Figure 17:
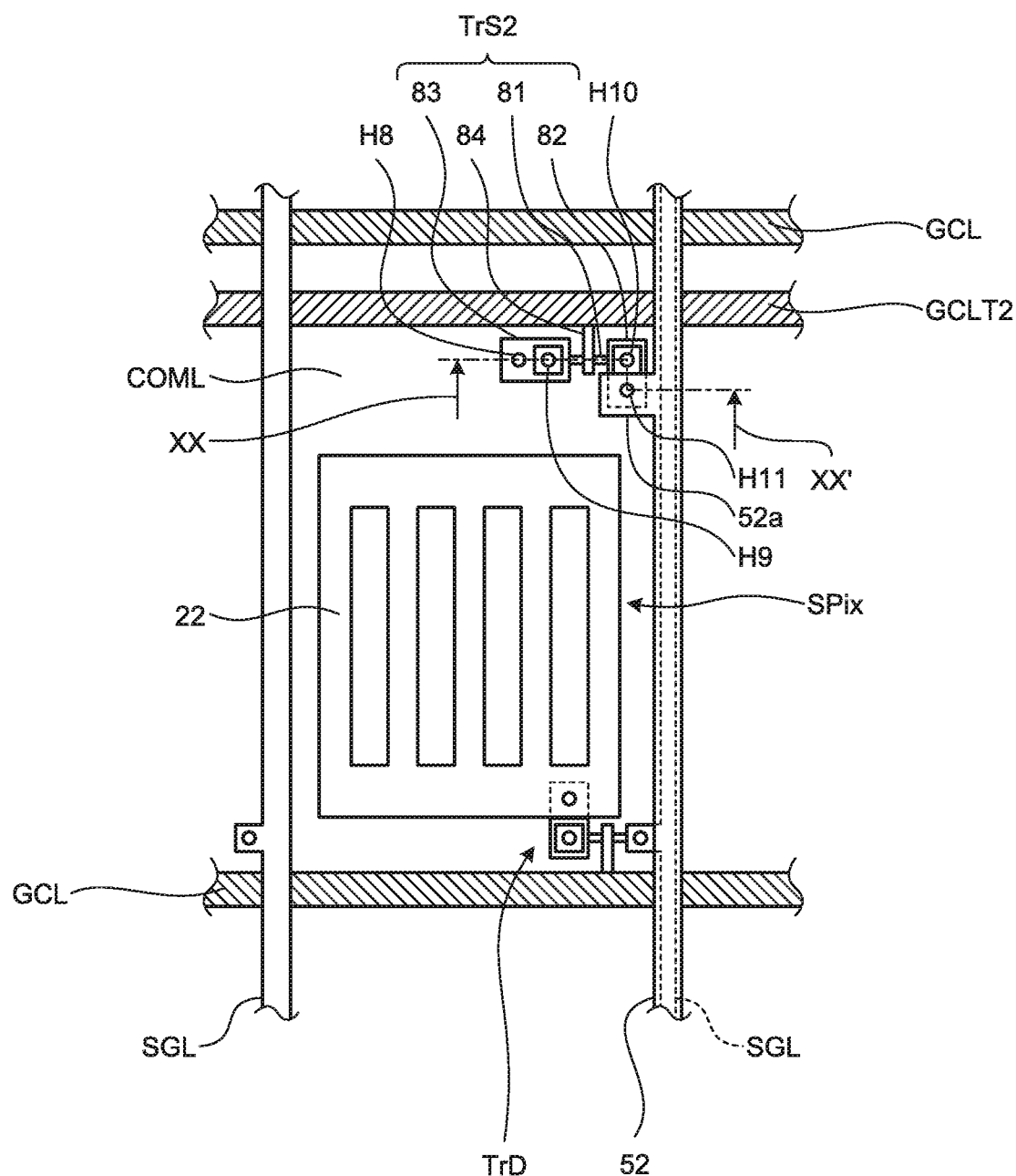
FIG. 17 is a plan view of the sub-pixel for explaining the coupling configuration between the detection electrode and a second signal line according to the first embodiment.
Figure 18:
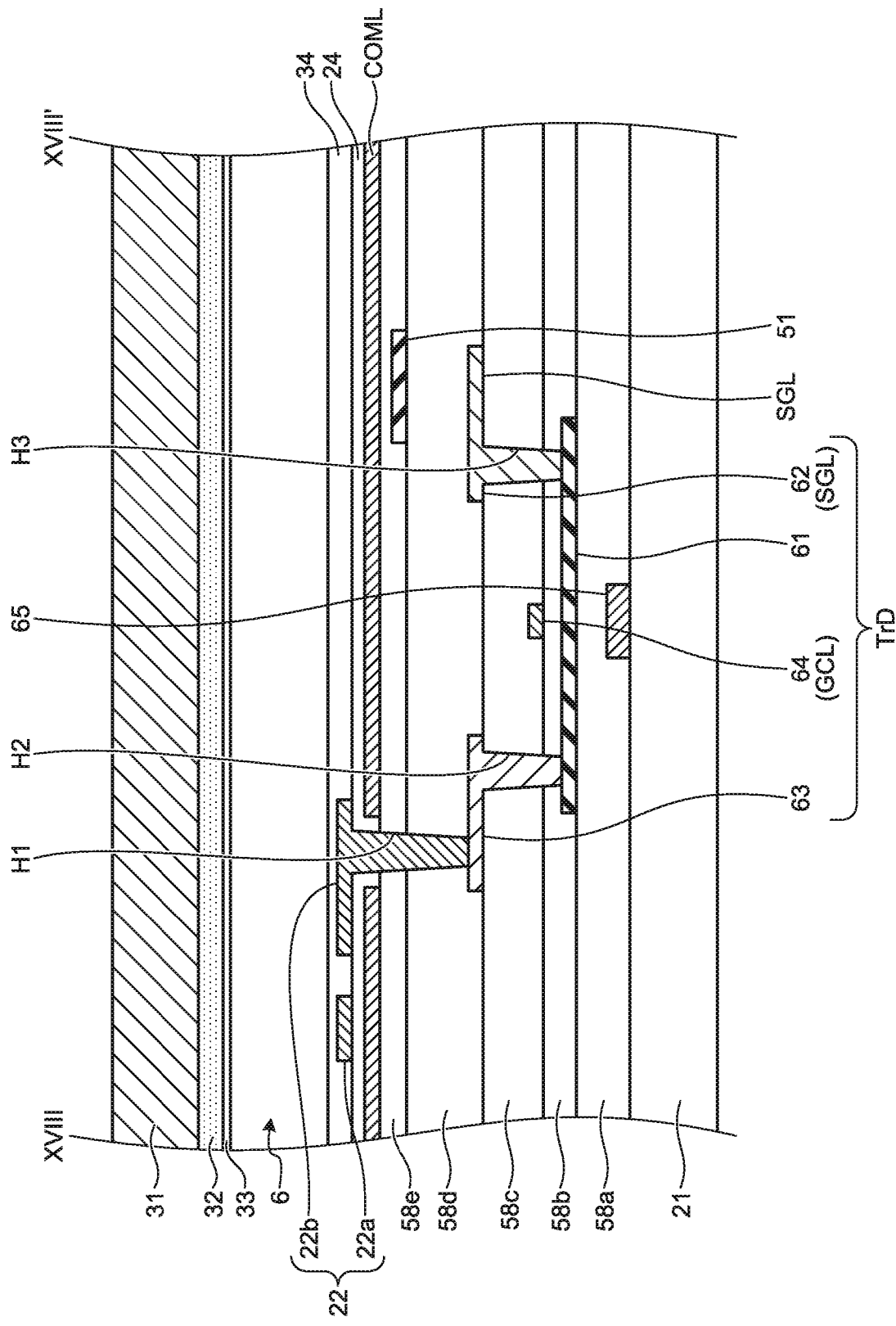
FIG. 18 is a sectional view along line XVIII-XVIII' in FIG. 16.
Figure 19:
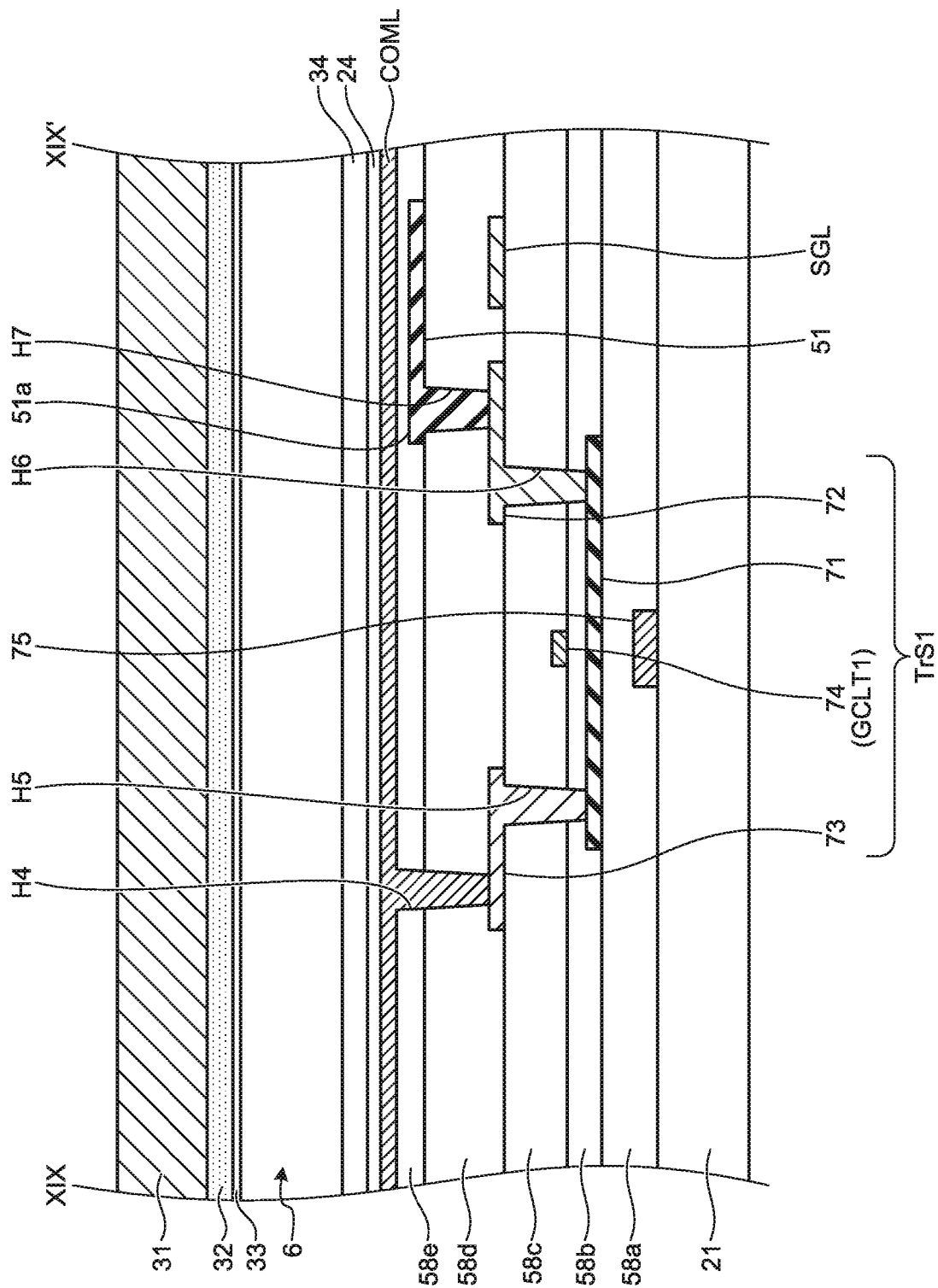
FIG. 19 is a sectional view along line XIX-XIX' in FIG. 16.
Figure 20:
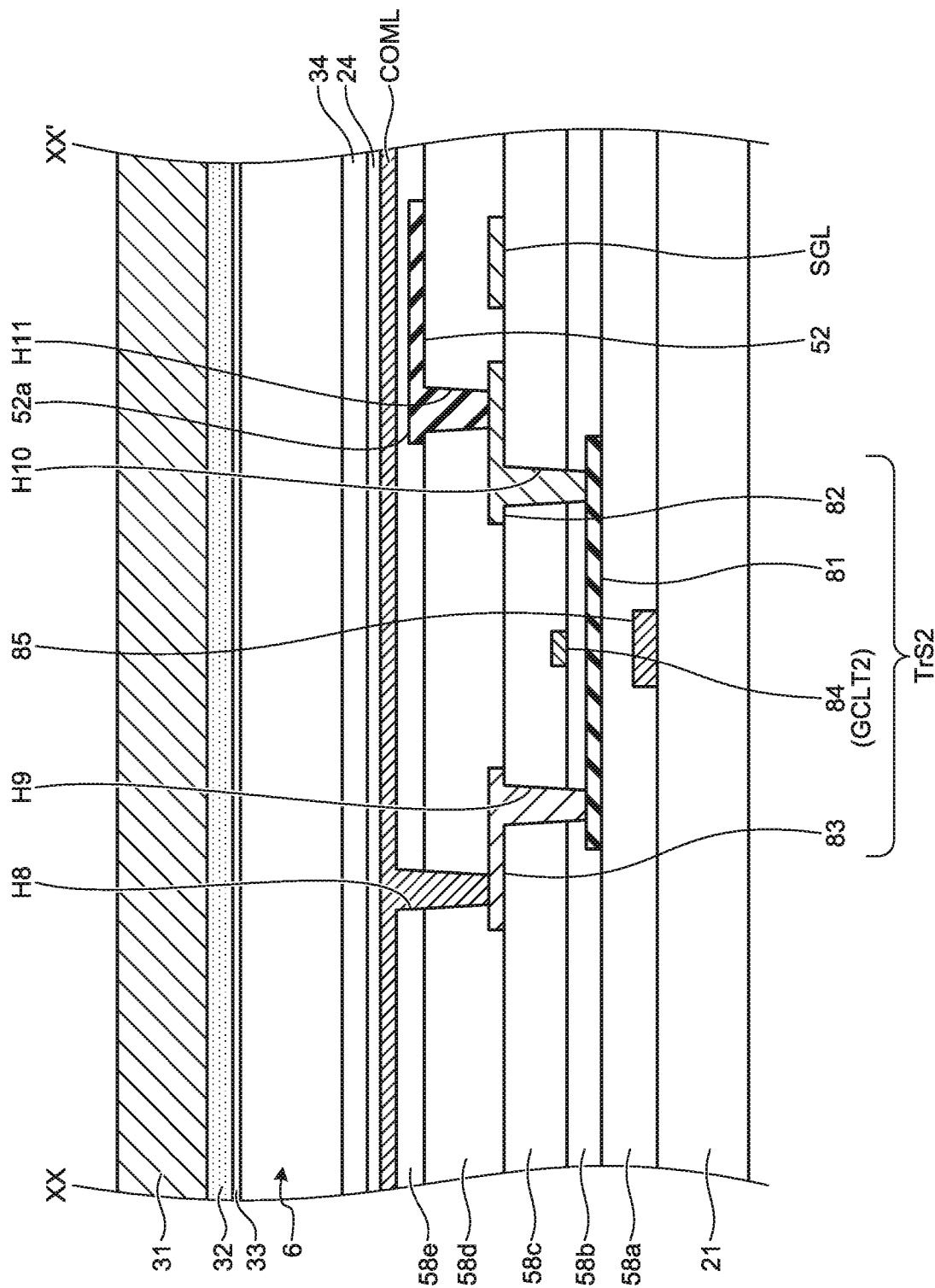
FIG. 20 is a sectional view along line XX-XX' in FIG. 17.

The following describes the coupling configuration between the detection electrodes COML and various kinds of wires and the coupling configuration between the pixel electrodes 22 and various kinds of wires. FIG. 15 is a plan view for explaining the configuration of the detection electrodes and the pixel electrodes according to a second embodiment of the present disclosure. FIG. 16 is a plan view of the sub-pixel for explaining the coupling configuration between the detection electrode and the first signal line and the coupling configuration between the pixel electrode and the display signal line according to the first embodiment. FIG. 17 is a plan view of the sub-pixel for explaining the coupling configuration between the detection electrode and the second signal line according to the first embodiment. FIG. 18 is a sectional view along line XVIII-XVIII' in FIG. 16. FIG. 19 is a sectional view along line XIX-XIX' in FIG. 16. FIG. 20 is a sectional view along line XX-XX' in FIG. 17.

As illustrated in FIG. 15, a plurality of pixel electrodes 22 are provided overlapping one detection electrode COML. The display switching elements TrD are provided at positions corresponding to the respective pixel electrodes 22. The display gate lines GCL extend in the row direction and are arrayed in the column direction. The display signal lines SGL intersect the display gate lines GCL and are arrayed in the row direction. The display switching elements TrD are disposed at the respective intersections of the display gate lines GCL and the display signal lines SGL. The area surrounded by the display gate lines GCL and the display signal lines SGL corresponds to one sub-pixel SPix. The Sub-pixel SPix includes an area in which the pixel electrode 22 overlaps the detection electrode COML.

The pixel electrodes 22 are coupled to the display signal lines SGL via the respective display switching elements TrD. In FIG. 15, the pixel electrodes 22 in five columns are provided to one detection electrode COML. The configuration is not limited thereto, and the pixel electrodes 22 in six or more columns or four or less columns may be provided to one detection electrode COML.

The first gate line for detection GCLT1 extends along a display gate line GCL. The second gate line for detection GCLT2 extends along another display gate line GCL different from the display gate line GCL facing the first gate line for detection GCLT1. The first signal line 51 extends along a display signal line SGL. The second signal line 52 extends along another display signal line SGL different from the display signal line SGL under the first signal line 51. The first signal line 51 and the second signal line 52 are provided overlapping the respective display signal lines SGL in planar view.

The first switching element TrS1 is disposed at the intersection of the first gate line GCLT1 and the first signal line 51. The second switching element TrS2 is disposed at the intersection of the second gate line GCLT2 and the second signal line 52. The detection electrode COML is coupled to the first signal line 51 via the first switching element TrS1 and to the second signal line 52 via the second switching element TrS2.

As illustrated in FIGS. 15 and 16, the pixel electrode 22 includes a plurality of strip electrodes 22a and connections 22b. The strip electrodes 22a extend along the display signal lines SGL and are arrayed in the direction along the display gate lines GCL. The connections 22b each connect the ends of the strip electrodes 22a. The pixel electrode 22 includes five strip electrodes 22a. The configuration is not limited thereto, and the pixel electrode 22 may include four or less or six or more strip electrodes 22a. The pixel electrode 22 may include two or one strip electrode 22a, for example.

As illustrated in FIGS. 16 and 18, the display switching element TrD includes a semiconductor layer 61, a source electrode 62, a drain electrode 63, and a gate electrode 64. A light-shielding layer 65 is provided below the semiconductor layer 61.

As illustrated in FIG. 18, the light-shielding layer 65 is provided on the first substrate 21. An insulating layer 58a is provided covering the light-shielding layer 65 on the first substrate 21. The semiconductor layer 61 is provided on the insulating layer 58a. The gate electrode 64 (display gate line GCL) is provided above the semiconductor layer 61 with an insulating layer 58b interposed therebetween. The drain electrode 63 and the source electrode 62 (display signal line SGL) are provided above the gate electrode 64 (display gate line GCL) with an insulating layer 58c interposed therebetween. The first signal line 51 is provided above the drain electrode 63 and the source electrode 62 (display signal line SGL) with an insulating layer 58d interposed therebetween. The detection electrode COML is provided above the first signal line 51 with an insulating layer 58e interposed therebetween. As described above, the pixel electrode 22 is provided above the detection electrode COML with the insulating layer 24 interposed therebetween. An orientation film 34 is provided on the pixel electrode 22. An orientation film 33 faces the orientation film 34 with the liquid crystal layer 6 interposed therebetween.

As illustrated in FIGS. 16 and 18, the pixel electrode 22 is coupled to the drain electrode 63 of the display switching element TrD through a contact hole H1. The semiconductor layer 61 is coupled to the drain electrode 63 through a contact hole H2. The semiconductor layer 61 intersects the gate electrode 64 in planar view. The gate electrode 64 is coupled to the display gate line GCL and protrudes from one side of the display gate line GCL. In other words, part of the display gate line GCL functions as the gate electrode 64. The semiconductor layer 61 extends to a position under the source electrode 62 and is electrically coupled to the source electrode 62 through a contact hole H3. The source electrode 62 is coupled to the display signal line SGL and protrudes from one side of the display signal line SGL. In other words, part of the display signal line SGL functions as the source electrode 62. As illustrated in FIG. 18, the first signal line 51 is provided to a layer different from the layers of the display signal line SGL and the display gate line GCL. The first signal line 51 is not electrically coupled to the display switching element TrD.

The semiconductor layer 61 may be made of a publicly known material, such as polysilicon and an oxide semiconductor. The use of a transparent amorphous oxide semiconductor (TAOS), for example, can increase the ability (retention) to retain a voltage for video display for a long time and improve the display quality.

The semiconductor layer 61 has a channel at a portion under the gate electrode 64. The light-shielding layer 65 is preferably provided under the channel and has an area larger than that of the channel. The light-shielding layer 65 blocks light output from the backlight and entering into the semiconductor layer 61, for example.

As illustrated in FIGS. 16 and 19, the first switching element TrS1 includes a semiconductor layer 71, a source electrode 72, a drain electrode 73, and a gate electrode 74. A light-shielding layer 75 is provided below the semiconductor layer 71.

The multilayered structure of the semiconductor layer 71, the source electrode 72, the drain electrode 73, and the gate electrode 74 is the same as that of the display switching element TrD illustrated in FIG. 18. As illustrated in FIG. 19, the source electrode 72 and the drain electrode 73 are provided to the same layer as that of the display signal line SGL. The first signal line 51 is provided between the detection electrode COML and the source electrode 72, the drain electrode 73, and the display signal line SGL in a direction perpendicular to the surface of the first substrate 21. The first gate line GCLT1 is provided to the same layer as that of the display gate line GCL.

As illustrated in FIGS. 16 and 19, the detection electrode COML is coupled to the drain electrode 73 of the first switching element TrS1 through a contact hole H4. The semiconductor layer 71 is coupled to the drain electrode 73 through a contact hole H5. The semiconductor layer 71 intersects the gate electrode 74 in planar view. The gate electrode 74 is coupled to the first gate line GCLT1 and protrudes from one side of the first gate line GCLT1. In other words, part of the first gate line GCLT1 functions as the gate electrode 74.

The semiconductor layer 71 extends to a position under the source electrode 72 and is electrically coupled to the source electrode 72 through a contact hole H6. The source electrode 72 is coupled to a coupler 51a of the first signal line 51 through a contact hole H7. The coupler 51a protrudes from one side of the first signal line 51 and is provided to a position not overlapping with the display signal line SGL. As illustrated in FIG. 19, the display signal line SGL is not electrically coupled to the first switching element TrS1.

As illustrated in FIGS. 17 and 20, the second switching element TrS2 includes a semiconductor layer 81, a source electrode 82, a drain electrode 83, and a gate electrode 84. A light-shielding layer 85 is provided below the semiconductor layer 81. The second switching element TrS2 is provided corresponding to a sub-pixel SPix at a position different from that of the sub-pixel SPix provided with the first switching element TrS1.

The multilayered structure of the semiconductor layer 81, the source electrode 82, the drain electrode 83, and the gate electrode 84 is the same as that of the first switching element TrS1 illustrated in FIG. 19. As illustrated in FIG. 20, the source electrode 82 and the drain electrode 83 are provided to the same layer as that of the display signal line SGL. The second signal line 52 is provided between the detection electrode COML and the source electrode 82, the drain electrode 83, and the display signal line SGL in the direction perpendicular to the surface of the first substrate 21. In other words, the second signal line 52 is provided to the same layer as that of the first signal line 51 illustrated in FIGS. 18 and 19. The second gate line GCLT2 is provided to the same layer as that of the first gate line GCLT1 and the display gate line GCL.

This configuration can provide the various kinds of wires without increasing the number of layers in the display device 1. The first gate lines GCLT1 and the second gate lines GCLT2 can be produced in the same process as that of the display gate lines GCL. The first signal lines 51 can be produced in the same process as that of the second signal lines 52. Consequently, the display device 1 can be manufactured at a lower cost.

As illustrated in FIGS. 17 and 20, the detection electrode COML is coupled to the drain electrode 83 of the second switching element TrS2 through a contact hole H8. The semiconductor layer 81 is coupled to the drain electrode 83 through a contact hole H9. The semiconductor layer 81 intersects the gate electrode 84 in planar view. The gate electrode 84 is coupled to the second gate line GCLT2 and protrudes from one side of the second gate line GCLT2. In other words, part of the second gate line GCLT2 functions as the gate electrode 84.

The semiconductor layer 81 extends to a position under the source electrode 82 and is electrically coupled to the source electrode 82 through a contact hole H10. The source electrode 82 is coupled to a coupler 52a of the second signal line 52 through a contact hole H11. The coupler 52a protrudes from one side of the second signal line 52 and is provided to a position not overlapping with the display signal line SGL. As illustrated in FIG. 20, the display signal line SGL is not electrically coupled to the second switching element TrS2.

With this configuration, the pixel electrode 22 is coupled to the display switching element TrD, and the detection electrode COML is coupled to the first switching element TrS1 and the second switching element TrS2. The configurations illustrated in FIGS. 18 to 20 are given by way of example only and may be appropriately modified. The display switching element TrD, for example, may be provided to a layer different from that of the first switching element TrS1 and the second switching element TrS2.

As described above, the display device 1 according to the present embodiment includes the first substrate 21, the detection electrodes COML, the detection electrode driver 14 (drive circuit), the detector 40, and the switching circuit 16. The detection electrodes COML are provided in the display area 10a of the first substrate 21. The detection electrode driver 14 supplies the drive signals Vcom to the detection electrodes COML. The detector 40 receives, from the detection electrodes COML, the detection signals Vdet corresponding to capacitance changes in the detection electrodes COML occurring when the drive signals Vcom are supplied. The switching circuit 16 is coupled to the detector 40 via the wires L1 and changes the number of detection electrodes COML coupled to one wire L1 based on the detection signals Vdet.

In touch detection, the detection electrode driver 14 supplies the drive signals Vcom to the detection electrodes COML, and the detector 40 detects touch input based on the detection signals Vdet from the respective detection electrodes COML. Consequently, the detector 40 can perform touch detection with detection accuracy corresponding to the array pitch of the detection electrodes COML. In hover detection, the detection electrode driver 14 simultaneously and collectively supplies the drive signals Vcom to a plurality of detection electrodes COML included in the detection electrode block COMLA. The detector 40 can perform hover detection based on the detection signals Vdet collectively output from one detection electrode block COMLA. With this configuration, the lines of electric force of an electric field generated from the detection electrode block COMLA reach a position further away from the display surface. Consequently, the display device 1 can increase the detection sensitivity in hover detection and accurately detect an object to be detected in the non-contact state.

Consequently, the display device 1 can perform accurate touch detection and satisfactory hover detection while using the detection electrodes COML both in touch detection and hover detection.

Second Embodiment

Figure 21:
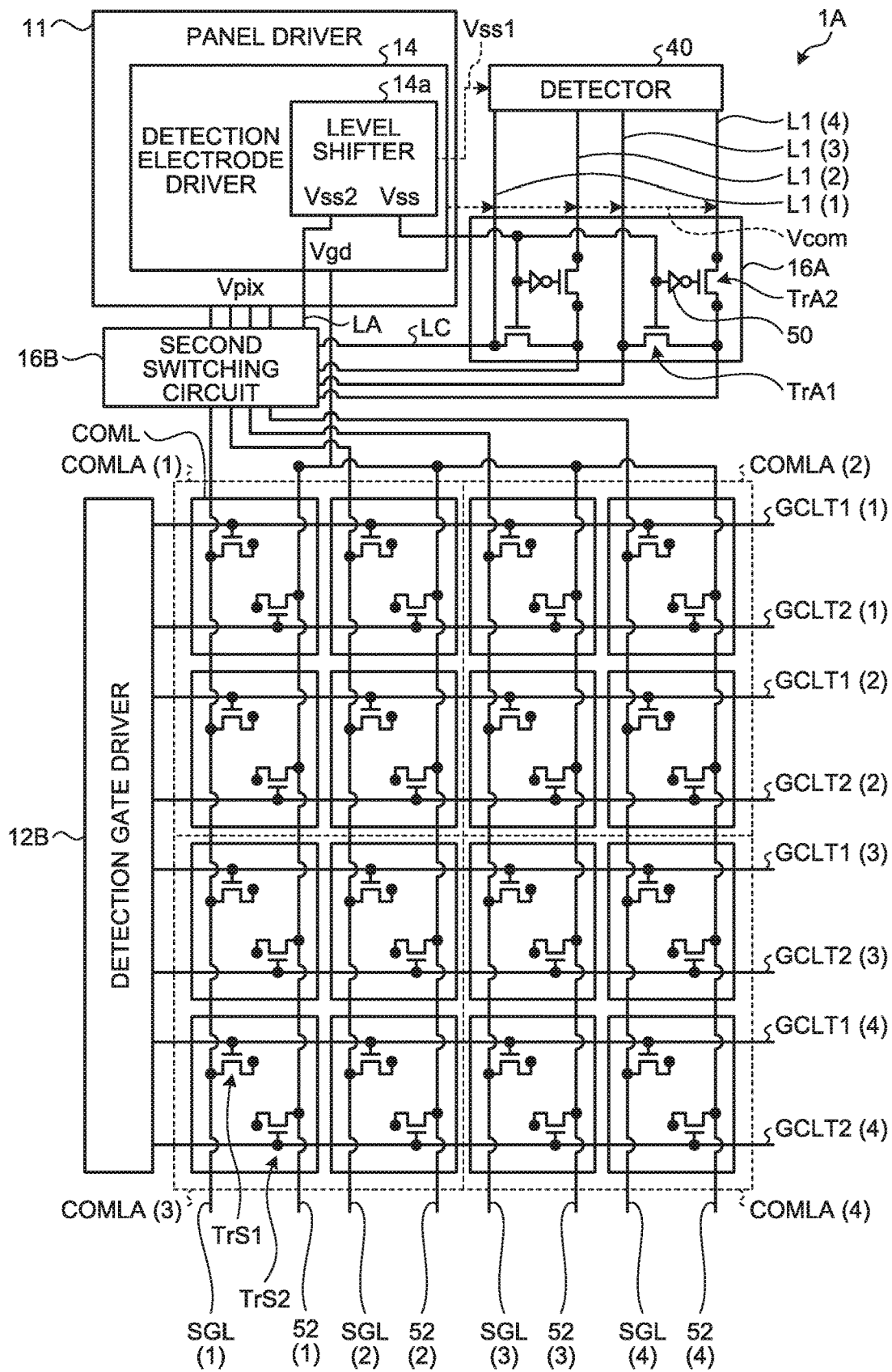
FIG. 21 is a circuit diagram for explaining the coupling configuration of the detection electrodes according to the second embodiment.
Figure 22:
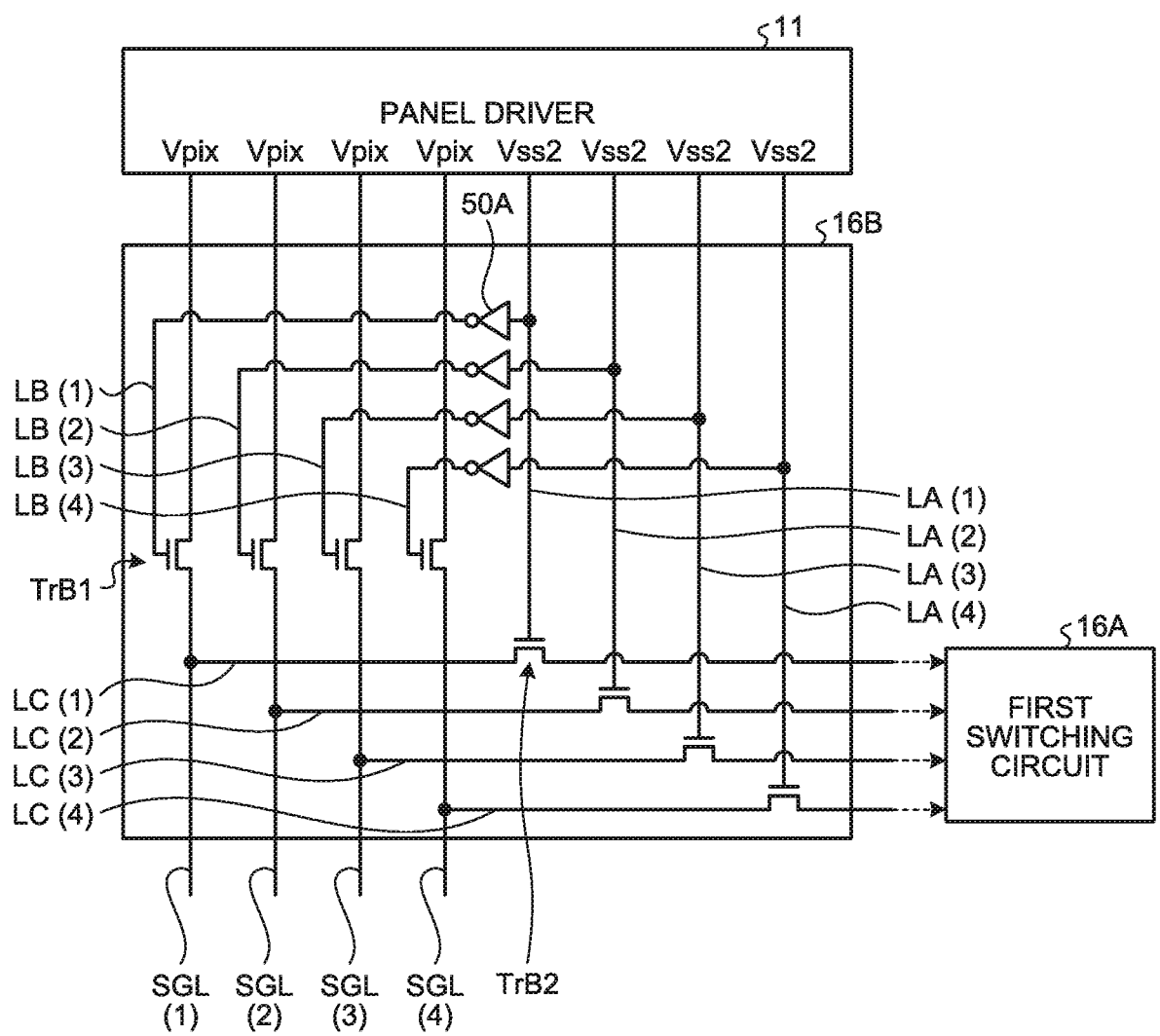
FIG. 22 is a circuit diagram of a second switching circuit according to the second embodiment.
Figure 23:
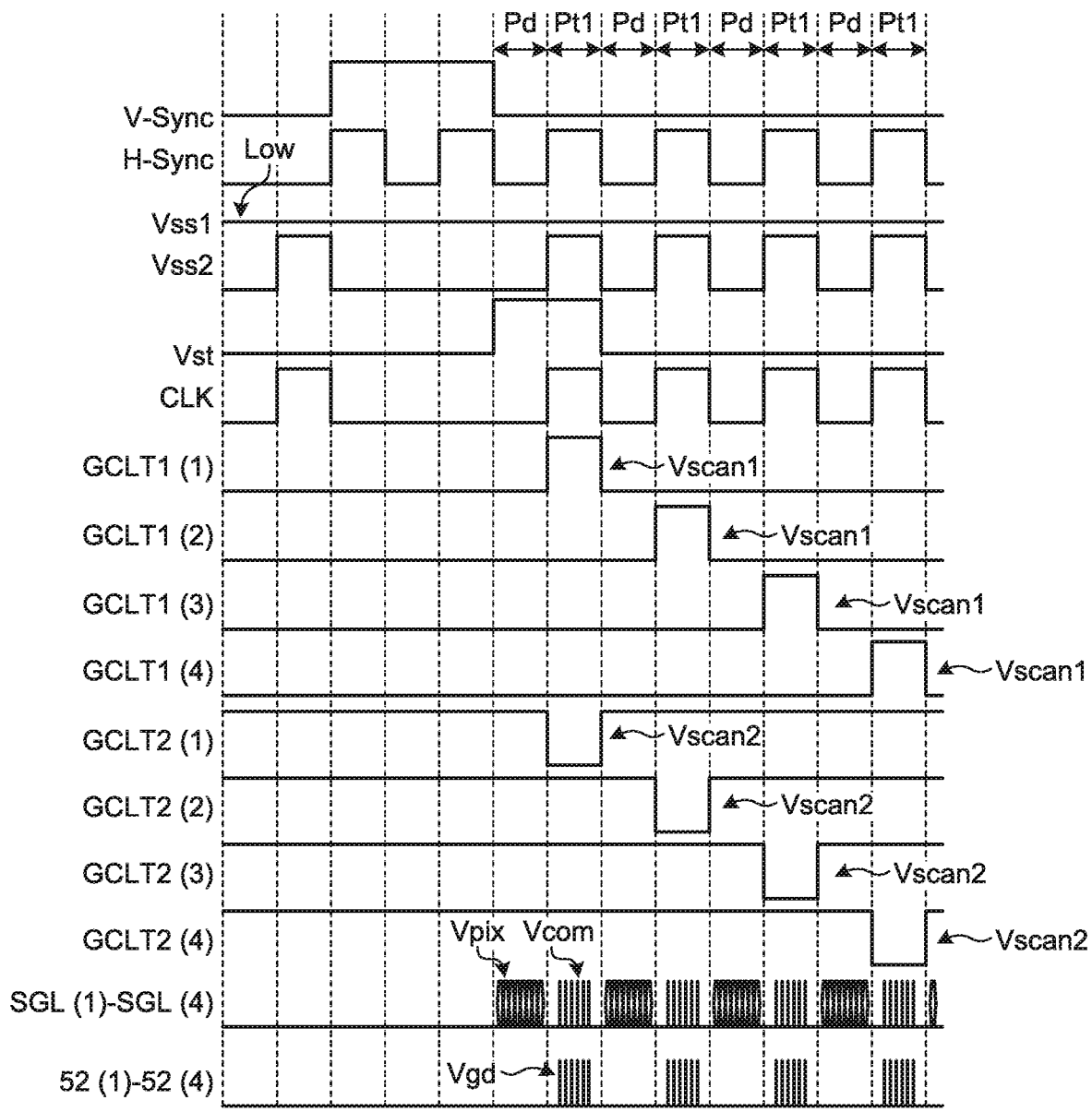
FIG. 23 is a timing waveform chart of an exemplary operation in touch detection performed by the display device according to the second embodiment.

FIG. 21 is a circuit diagram for explaining the coupling configuration of the detection electrodes according to the second embodiment. FIG. 22 is a circuit diagram of a second switching circuit according to the second embodiment. FIG. 23 is a timing waveform chart of an exemplary operation in touch detection performed by the display device according to the second embodiment. The same members as those according to the embodiment above are denoted by like reference numerals, and explanation thereof may be omitted.

As illustrated in FIG. 21, a display device 1A according to the present embodiment includes display signal lines SGL(1), SGL(2), SGL(3), and SGL(4) instead of the first signal lines 51(1), 51(2), 51(3), and 51(4) (refer to FIG. 8). In the following description, the display signal lines SGL(1), SGL(2), SGL(3), and SGL(4) are referred to as the display signal lines SGL when they need not be distinguished from one another.

The display device 1A further includes a first switching circuit 16A and a second switching circuit 16B. The first switching circuit 16A is provided between the detection electrodes COML and the detector 40. The second switching circuit 16B is provided between the detection electrodes COML and the panel driver 11. The first switching circuit 16A is coupled to the second switching circuit 16B via wires LC.

The display signal lines SGL extend in the column direction and are arrayed in the row direction. One display signal line SGL is coupled to the detection electrodes COML arrayed in the column direction via the respective first switching elements TrS1. One second signal line 52 is coupled to the detection electrodes COML arrayed in the column direction via the respective second switching elements TrS2. The display signal lines SGL are coupled to the second switching circuit 16B. The second signal lines 52 are coupled to the panel driver 11.

As described above, the display signal lines SGL are provided corresponding to the sub-pixels SPix arrayed in the row direction. One display signal line SGL under one detection electrode COML out of the display signal lines provided corresponding to the sub-pixels SPix is also used as a detection wire according to the present embodiment.

The first switching circuit 16A has a configuration similar to that of the first embodiment. The first switching circuit 16A changes the coupling state of the wires LC coupled to the second switching circuit 16B based on a first sensor coupling signal Vss1. Consequently, the first switching circuit 16A can change the number of detection electrodes COML coupled to one wire L1 between touch detection and hover detection. The second switching circuit 16B switches between coupling the display signal lines SGL to the panel driver 11 and coupling the display signal lines SGL to the detector 40. The level shifter 14a of the panel driver 11 supplies a second sensor coupling signal Vss2 to the second switching circuit 16B. The second switching circuit 16B changes the coupling state of the display signal lines SGL based on the second sensor coupling signal Vss2.

Part or all of the first switching circuit 16A and the second switching circuit 16B are provided to the frame area 10b of the first substrate 21. Part or all of the first switching circuit 16A and the second switching circuit 16B may be provided to the panel driver 11 of the display panel 10 or an external processor, for example.

As illustrated in FIG. 22, the second switching circuit 16B includes fifth switching elements TrB1, sixth switching elements TrB2, and inverters 50A. The fifth switching elements TrB1 and the sixth switching elements TrB2 are n-channel MOS TFTs, for example.

The fifth switching element TrB1 switches between coupling and cutting off the display signal line SGL to and from the panel driver 11. The fifth switching elements TrB1 are provided corresponding to the respective display signal lines SGL.

The sixth switching element TrB2 switches between coupling and cutting off the wire LC to and from the first switching circuit 16A. The wire LC branches off from the display signal line SGL. The sixth switching elements TrB2 are provided corresponding to the respective wires LC coupled to the display signal lines SGL.

The second sensor coupling signal Vss2 is supplied from the level shifter 14a of the panel driver 11 to the sixth switching elements TrB2 via respective wires LA. Simultaneously, the second sensor coupling signal Vss2 is also supplied to the fifth switching elements TrB1 via the respective inverters 50A coupled to the wires LA and via respective wires LB. The wires LA, LB, and LC are provided corresponding to the respective display signal lines SGL. The inverter 50A is an inverting circuit that inverts the polarity of the second sensor coupling signal Vss2 and outputs it. In other words, if the inverter 50A receives the second sensor coupling signal Vss2 at a high level, the inverter 50A outputs a low-level voltage signal. If the inverter 50A receives the second sensor coupling signal Vss2 at a low level, the inverter 50A outputs a high-level voltage signal.

Consequently, the fifth switching element TrB1 and the sixth switching element TrB2 perform opposite operations. In other words, when the fifth switching element TrB1 is turned on, the sixth switching element TrB2 is turned off. When the fifth switching element TrB1 is turned off, the sixth switching element TrB2 is turned on.

As illustrated in FIG. 23, in the display period Pd and the touch detection period Pt1, the level shifter 14a supplies the first sensor coupling signal Vss1 at a low level (low) to the first switching circuit 16A. As a result, the wires LC are cut off from each other, and one display signal line SGL is coupled to one wire L1 via the wire LC.

In the display period Pd and the touch detection period Pt1, the level shifter 14a supplies the second sensor coupling signal Vss2 to the second switching circuit 16B. The second sensor coupling signal Vss2 is a voltage signal that changes the voltage level synchronously with the clock signal CLK. The second sensor coupling signal Vss2 is at a low level in the display period Pd and at a high level in the touch detection period Pt1.

In the display period Pd, the second sensor coupling signal Vss2 is at a low level. As a result, the fifth switching elements TrB1 illustrated in FIG. 22 are turned on, and the sixth switching elements TrB2 are turned off. The display signal lines SGL are cut off from the first switching circuit 16A and coupled to the panel driver 11. In the display period Pd, the first scanning signal Vscan1 is at a low level, whereby the first switching elements TrS1 are turned off. As a result, the display signal lines SGL are not coupled to the detection electrodes COML.

In the display period Pd, the source driver 13 (refer to FIG. 1) of the panel driver 11 supplies the pixel signals Vpix to the pixel electrodes 22 via the display signal lines SGL. The display device 1A thus performs display. In the display period Pd, the detection electrode driver 14 supplies the display drive signals Vcomdc to the detection electrodes COML via the second signal lines 52 similarly to the first embodiment.

In the touch detection period Pt1, the second sensor coupling signal Vss2 is at a high level. As a result, the fifth switching elements TrB1 illustrated in FIG. 22 are turned off, and the sixth switching elements TrB2 are turned on. The display signal lines SGL are cut off from the panel driver 11 and coupled to the first switching circuit 16A via the wires LC. In the touch detection period Pt1, the detection electrode driver 14 (refer to FIG. 1) of the panel driver 11 supplies the drive signals Vcom to the display signal lines SGL via the first switching circuit 16A and the wires LC.

Similarly to the first embodiment, the detection gate driver 12B sequentially selects the first gate line GCLT1 and the second gate line GCLT2. In other words, in the touch detection period Pt1, the detection gate driver 12B supplies the first scanning signal Vscan1 at a high level to the first gate lines GCLT1. As a result, the first switching elements TrS1 are turned on, whereby the display signal lines SGL are coupled to the detection electrodes COML. The detection electrode driver 14 supplies the drive signals Vcom to the detection electrodes COML corresponding to the selected first gate line GCLT1 via the display signal lines SGL. The detection signals Vdet corresponding to capacitance changes in the respective detection electrodes COML are supplied to the detector 40 via the display signal lines SGL and the first switching circuit 16A.

As described above, the display device 1A according to the present embodiment can use the display signal lines SGL both in display and touch detection. Also in hover detection, the display device 1A can use the display signal lines SGL both in display and touch detection. In other words, in the hover detection period Pt2, the detection electrode driver 14 supplies the drive signals Vcom to the detection electrode blocks COMLA via the same display signal lines SGL.

Figure 24:
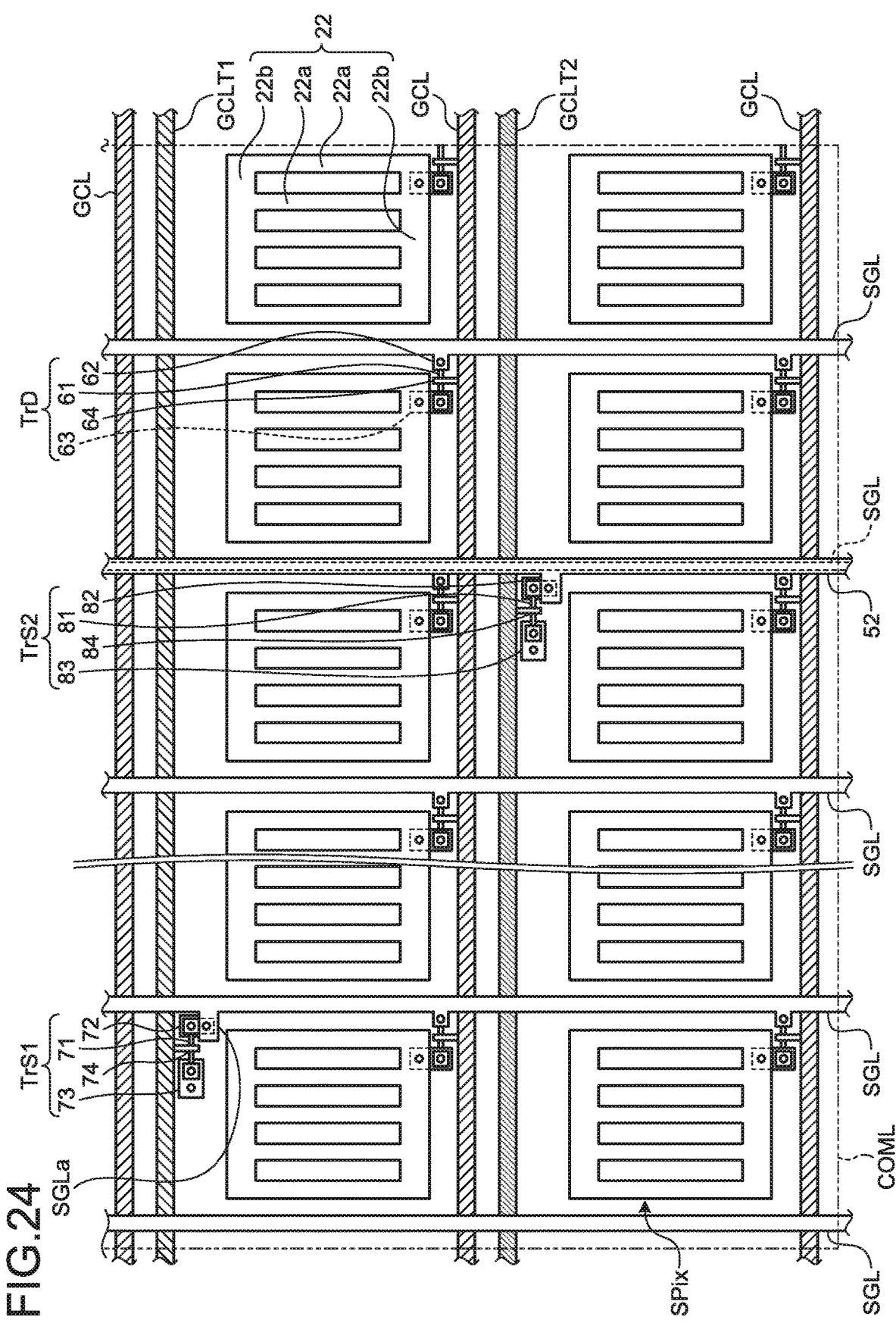
FIG. 24 is a plan view for explaining the configuration of the detection electrodes and the pixel electrodes according to the second embodiment.
Figure 25:
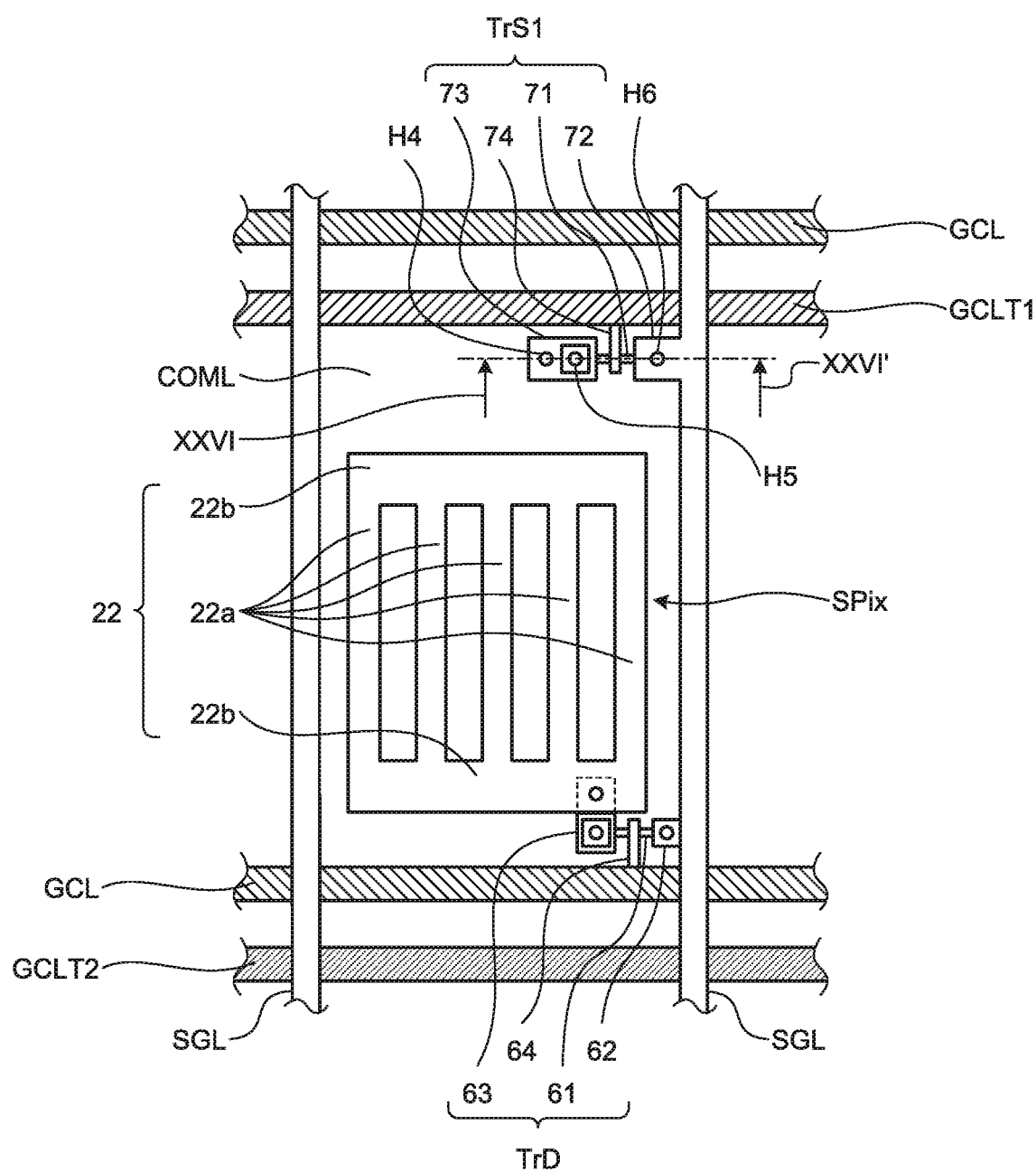
FIG. 25 is a plan view for explaining the configuration of the sub-pixel according to the second embodiment.
Figure 26:
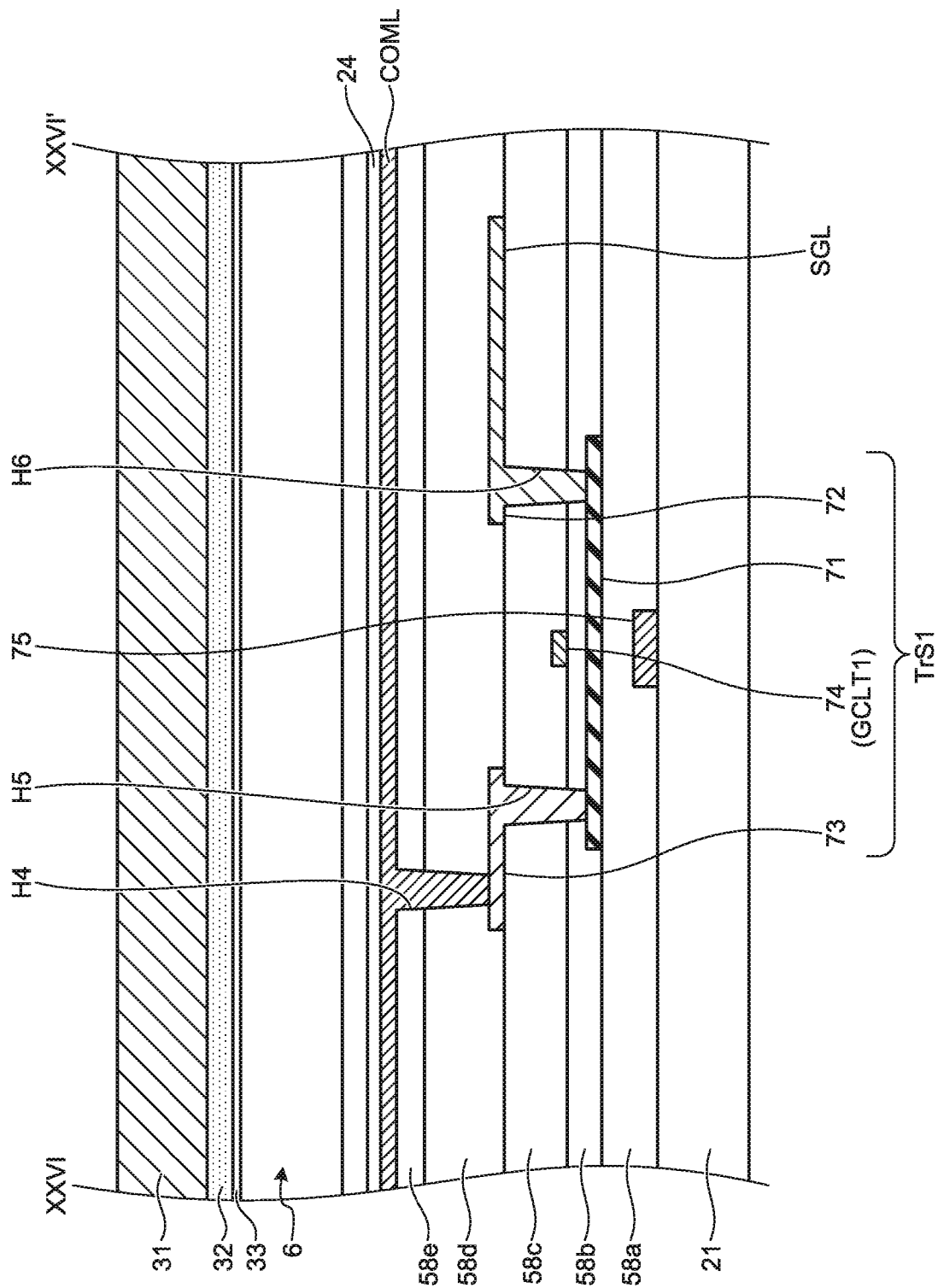
FIG. 26 is a sectional view along line XXVI-XXVI' in FIG. 25.

The following describes the coupling configuration between the detection electrodes COML and the various kinds of wires according to the present embodiment. FIG. 24 is a plan view for explaining the configuration of the detection electrodes and the pixel electrodes according to the second embodiment. FIG. 25 is a plan view for explaining the configuration of the sub-pixel according to the second embodiment. FIG. 26 is a sectional view along line XXVI-XXVI' in FIG. 25.

As illustrated in FIG. 25, the configuration of the present embodiment is different from that illustrated in FIG. 15 in that the first signal lines 51 are not provided. In other words, the coupling configuration between the pixel electrode 22, the display switching element TrD, the display gate line GCL, and the display signal line SGL is the same as those illustrated in FIGS. 16 and 18. The coupling configuration between the detection electrode COML, the second switching element TrS2, the second gate line GCLT2, and the second signal line 52 is the same as those illustrated in FIGS. 17 and 19.

As illustrated in FIGS. 24 and 25, the detection electrode COML according to the present embodiment is coupled to the display signal line SGL via the first switching element TrS1. As illustrated in FIG. 24, one display signal line SGL out of a plurality of display signal lines SGL under one detection electrode COML is coupled to the first switching element TrS1. In other words, one display signal line SGL used both for display and detection is coupled to the display switching element TrD and the first switching element TrS1.

As illustrated in FIGS. 25 and 26, the multilayered structure of the semiconductor layer 71, the source electrode 72, the drain electrode 73, and the gate electrode 74 is the same as that of the first switching element TrS1 illustrated in FIG. 19.

Specifically, as illustrated in FIGS. 25 and 26, the detection electrode COML is coupled to the drain electrode 73 of the first switching element TrS1 through a contact hole H4. The semiconductor layer 71 is coupled to the drain electrode 73 through a contact hole H5. The semiconductor layer 71 intersects the gate electrode 74 in planar view. The gate electrode 74 is coupled to the first gate line GCLT1 and protrudes from one side of the first gate line GCLT1. In other words, part of the first gate line GCLT1 functions as the gate electrode 74.

The semiconductor layer 71 extends to a position under the source electrode 72 and is electrically coupled to the source electrode 72 through the contact hole H6. As illustrated in FIG. 25, the source electrode 72 is coupled to the display signal line SGL and protrudes from one side of the display signal line SGL. Part of the display signal line SGL according to the present embodiment functions as the source electrode 72. As illustrated in FIG. 26, no first signal line 51 is provided between the display signal line SGL and the detection electrode COML in the direction perpendicular to the first substrate 21.

As described above, the present embodiment uses the same display signal lines SGL as signal lines both in display and detection (touch detection and hover detection). With this configuration, as illustrated in FIG. 26, the gap between the display signal lines SGL and the detection electrodes COML is larger than that between the first signal lines 51 and the detection electrodes COML according to the first embodiment (refer to FIG. 19). This configuration suppresses capacitive coupling between the display signal lines SGL and the detection electrodes COML in touch detection and hover detection, thereby reducing stray capacitance in the detection electrodes COML. Consequently, the present embodiment can increase the detection accuracy in touch detection and hover detection.

Third Embodiment

Figure 27:
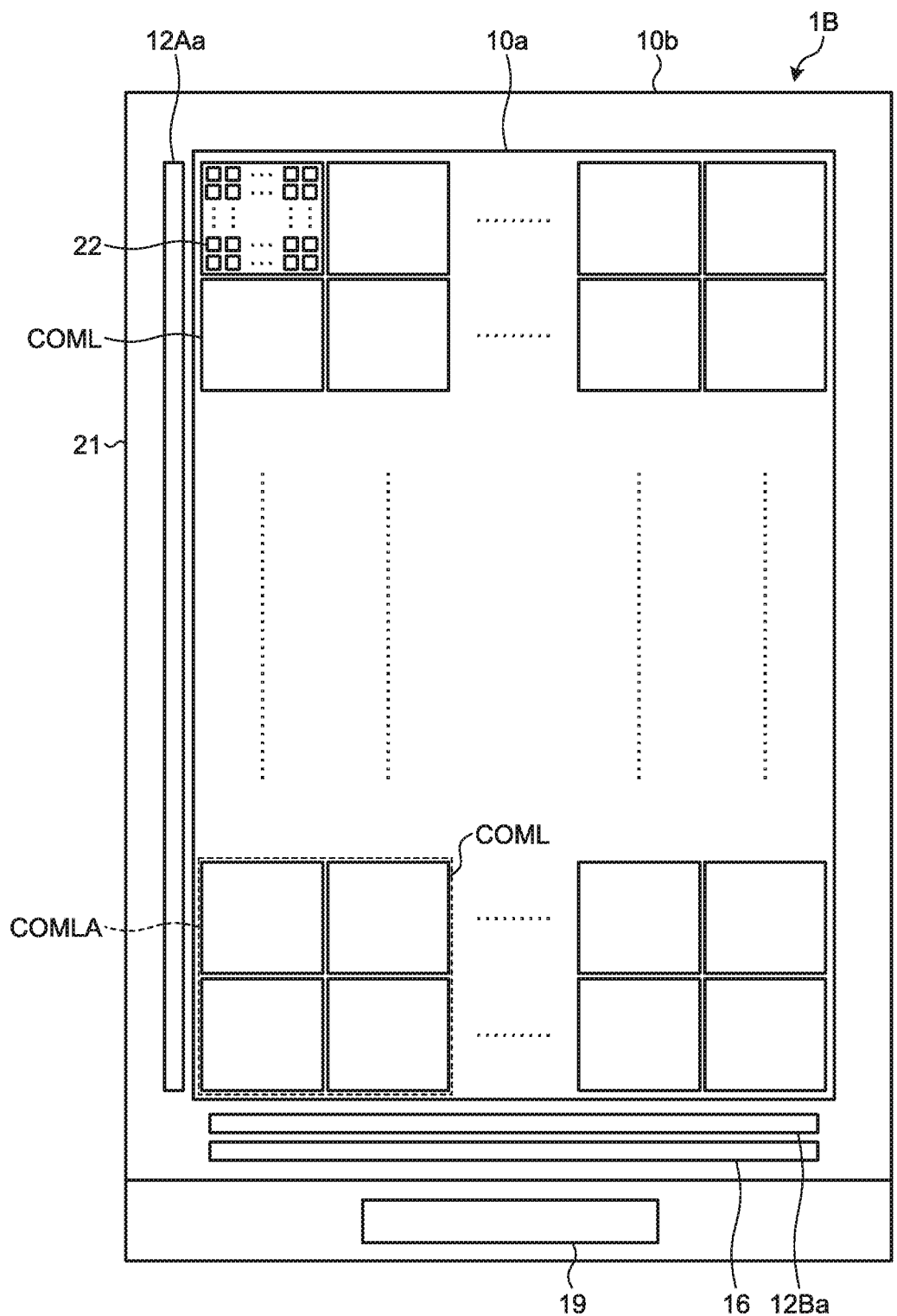
FIG. 27 is a plan view schematically illustrating the first substrate according to a third embodiment of the present disclosure.
Figure 28:
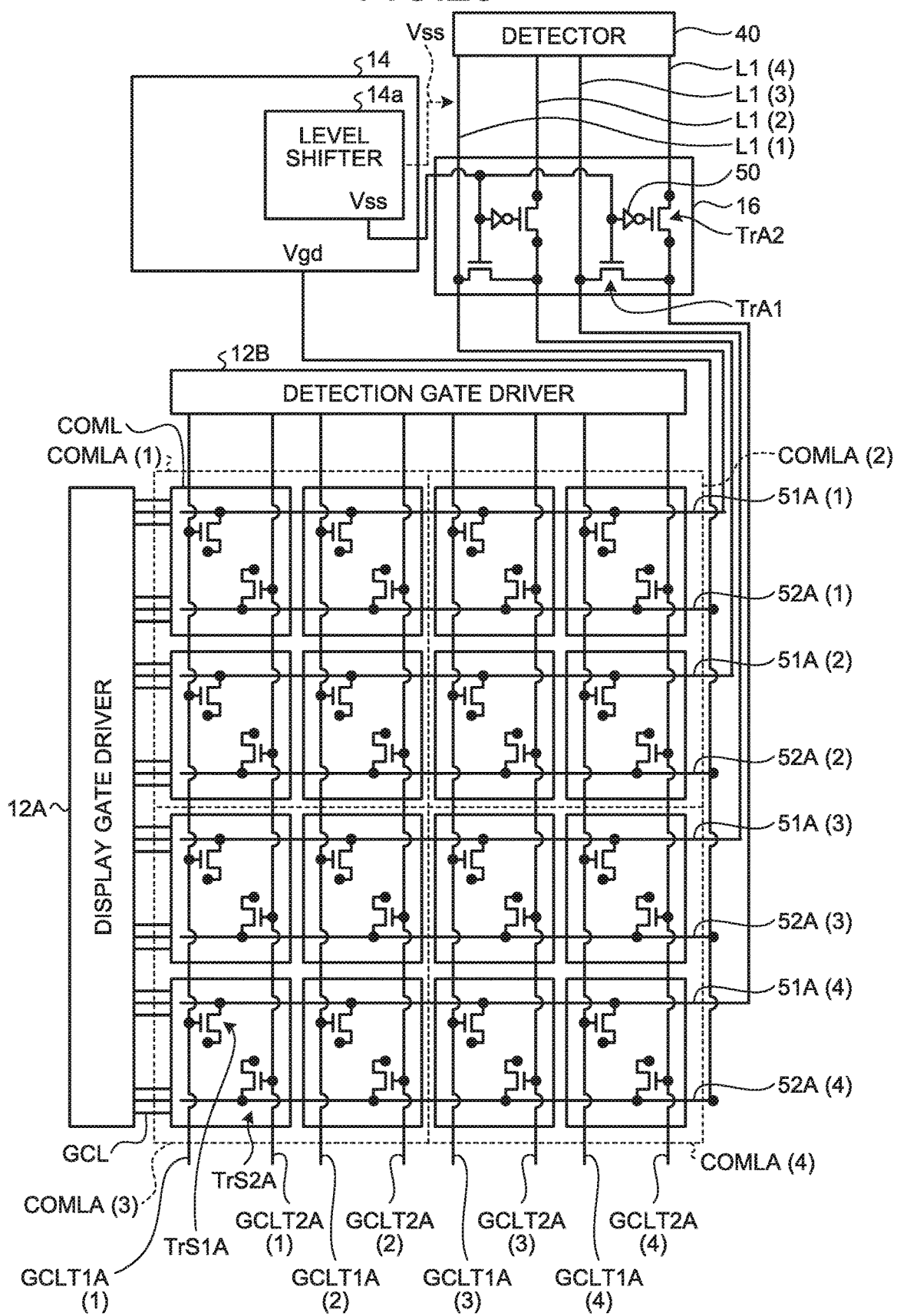
FIG. 28 is a circuit diagram for explaining the coupling configuration of the detection electrodes according to the third embodiment.

FIG. 27 is a plan view schematically illustrating the first substrate according to a third embodiment of the present disclosure. FIG. 28 is a circuit diagram for explaining the coupling configuration of the detection electrodes according to the third embodiment. In a display device 1B according to the present embodiment, as illustrated in FIG. 27, the shift register 12Aa is provided on the long side of the frame area 10b, and the shift register 12Ba is provided on the short side of the frame area 10b. As described above, the shift register 12Aa is a circuit that selects the display gate line GCL. The shift register 12Ba is a circuit that selects the first gate line for detection GCLT1 and the second gate line for detection GCLT2.

As illustrated in FIG. 28, first gate lines GCLT1A and second gate lines GCLT2A extend in the column direction and are arrayed in the row direction. One first gate line GCLT1A is provided under the detection electrodes COML arrayed in the column direction and coupled to first switching elements TrS1A corresponding to the respective detection electrodes COML. One second gate line GCLT2A is provided under the detection electrodes COML arrayed in the column direction and coupled to second switching elements TrS2A corresponding to the respective detection electrodes COML. One detection electrode COML is provided with one first gate line GCLT1A and one second gate line GCLT2A. The first gate lines GCLT1A and the second gate lines GCLT2A are coupled to the detection gate driver 12B.

The first gate lines GCLT1A and the second gate lines GCLT2A according to the present embodiment extend in the direction intersecting the display gate lines GCL in planar view.

First signal lines 51A and second signal lines 52A extend in the row direction and are arrayed in the column direction. The first signal lines 51A and second signal lines 52A extend along the display gate lines GCL and intersect the first gate lines GCLT1A and the second gate lines GCLT2A in planar view.

One first signal line 51A is provided under the detection electrodes COML arrayed in the row direction and coupled to the first switching elements TrS1A corresponding to the respective detection electrodes COML. One second signal line 52A is provided under the detection electrodes COML arrayed in the row direction and coupled to the second switching elements TrS2A corresponding to the respective detection electrodes COML. One detection electrode COML is provided with one first signal line 51A and one second signal line 52A. The first signal lines 51A are coupled to the switching circuit 16. The second signal lines 52A are coupled to the panel driver 11.

The switching circuit 16 has a configuration similar to that of the first embodiment. The switching circuit 16 changes the number of first signal lines 51A coupled to one wire L1 between touch detection and hover detection based on the sensor coupling signal Vss. In other words, in touch detection, the detection electrode driver 14 supplies the drive signals Vcom to the detection electrodes COML individually. The detection signals Vdet from the detection electrodes COML are supplied to the detector 40 via the switching circuit 16.

In hover detection, the detection electrode driver 14 collectively drives a plurality of detection electrode COML included in the detection electrode block COMLA. The detection electrode driver 14 supplies the drive signals Vcom to the detection electrode block COMLA via the first signal lines 51A. The detection signals Vdet from one detection electrode block COMLA are supplied to the detector 40 via the first signal lines 51A, the switching circuit 16, and one wire L1. Detailed explanation of display, touch detection, and hover detection according to the present embodiment is omitted because they are performed in the same manner as that in the exemplary operation illustrated in FIGS. 9 and 10.

Figure 29:
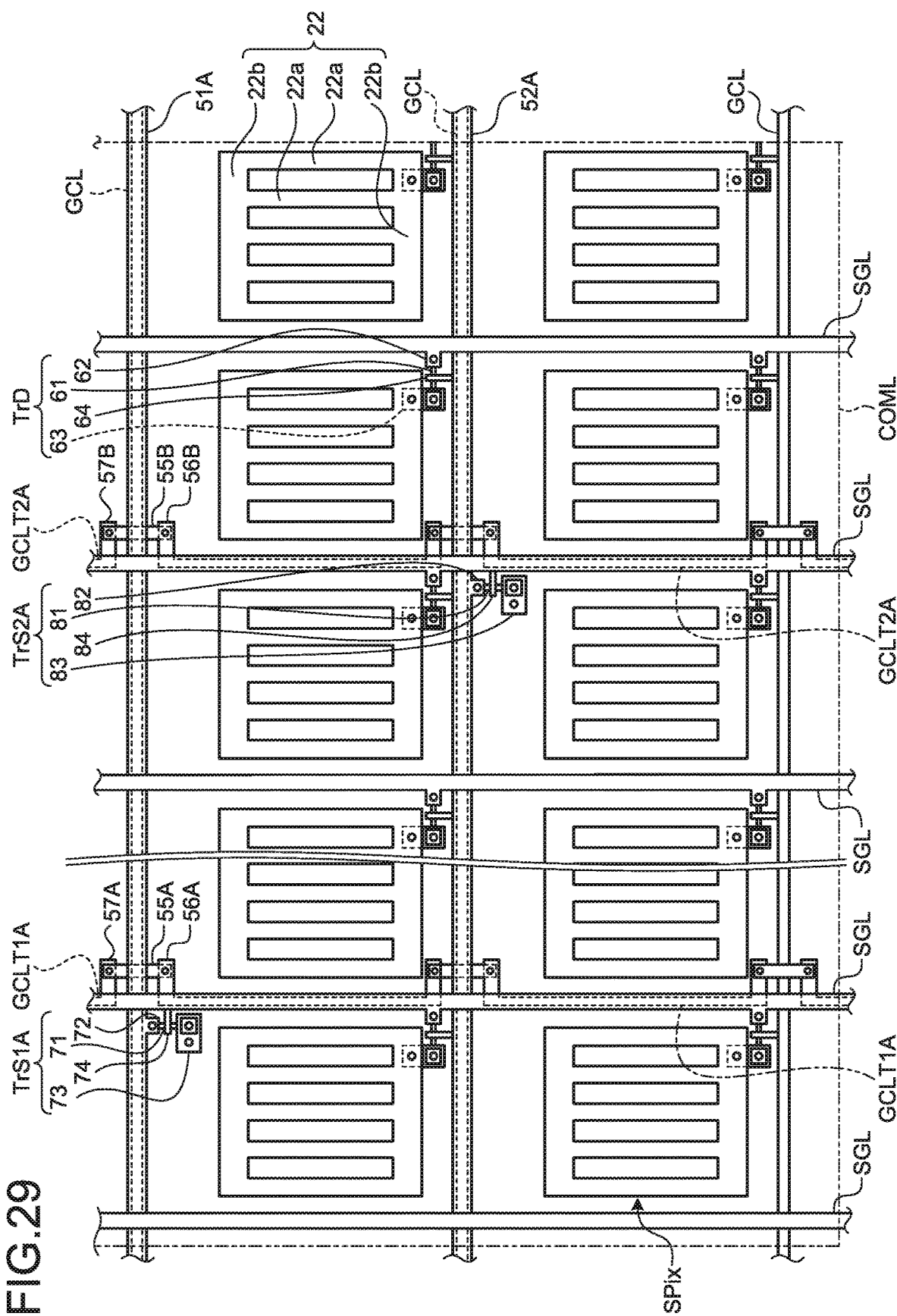
FIG. 29 is a plan view for explaining the configuration of the detection electrodes and the pixel electrodes according to the third embodiment.
Figure 30:
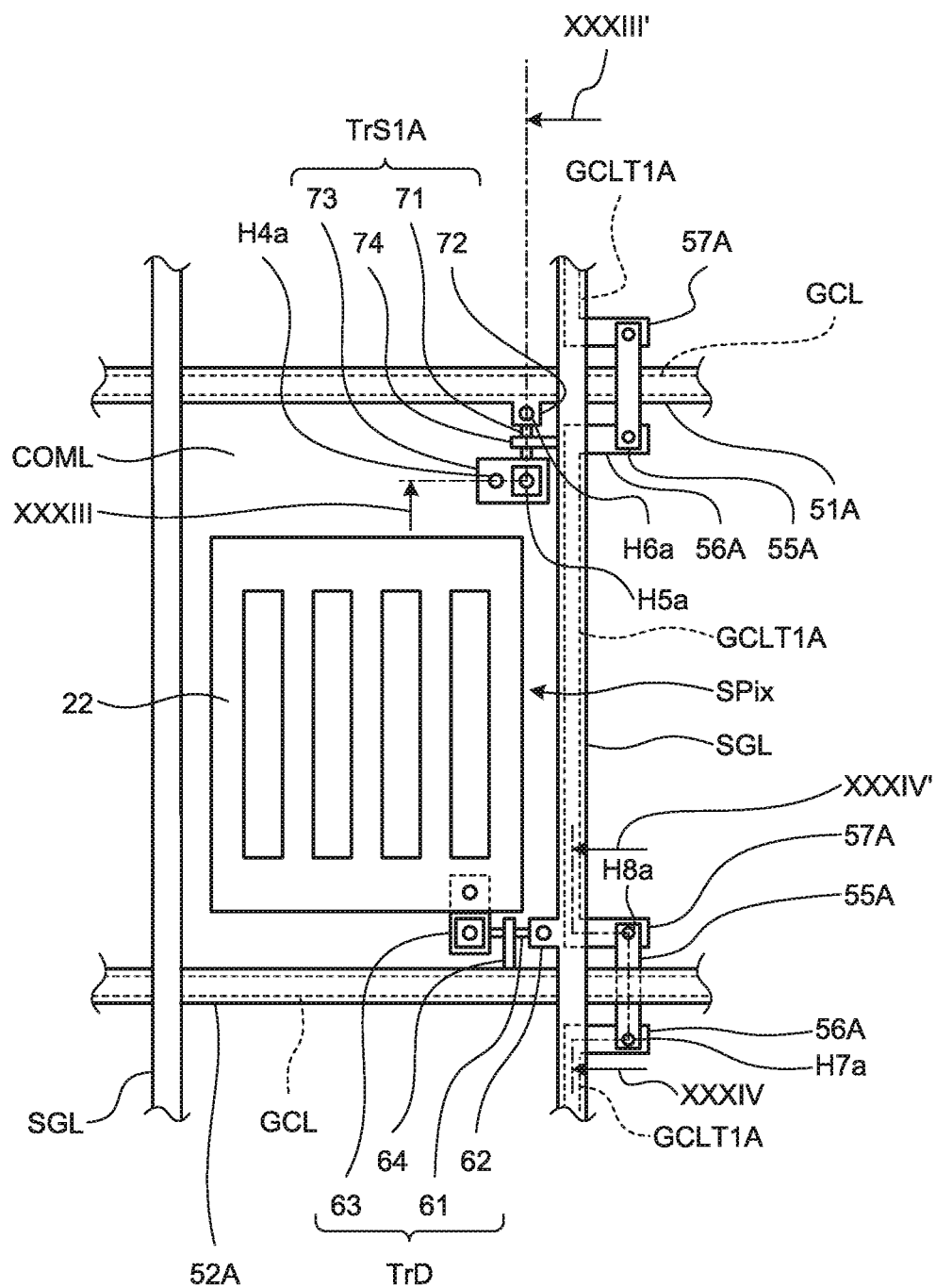
FIG. 30 is a plan view for explaining the configuration of the sub-pixel according to the third embodiment.
Figure 31:
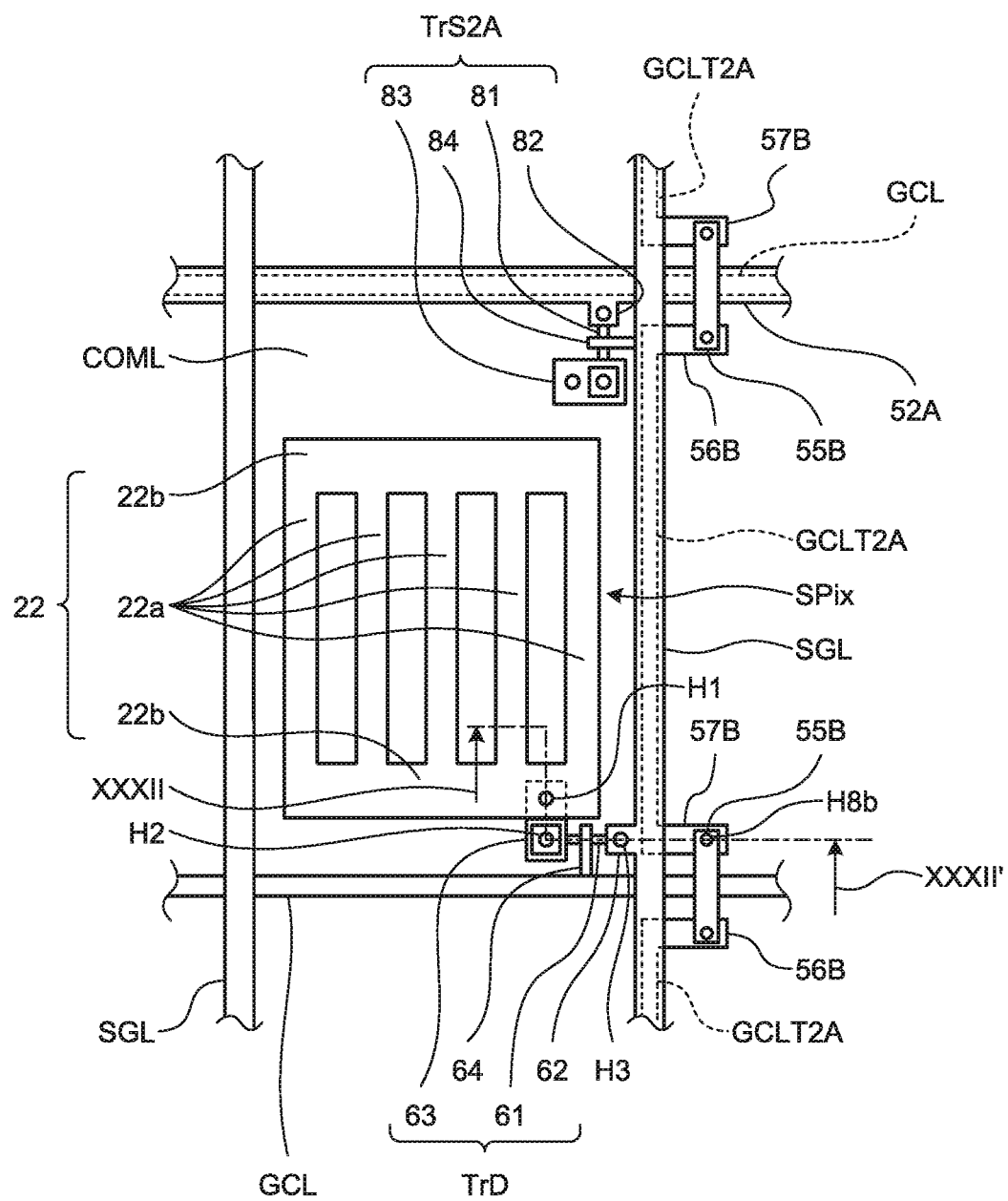
FIG. 31 is a plan view for explaining the configuration of another sub-pixel according to the third embodiment.
Figure 32:
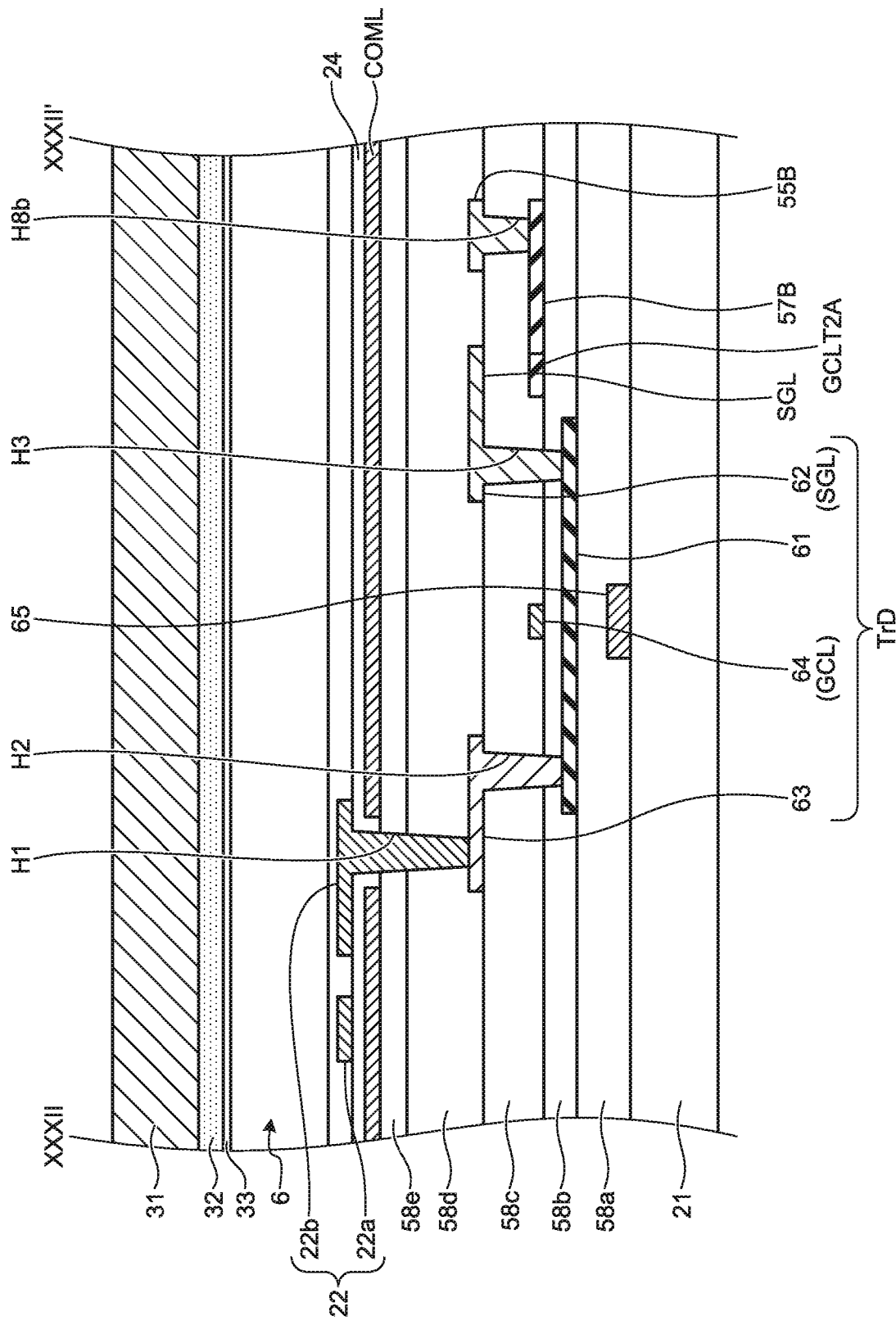
FIG. 32 is a sectional view along line XXXII-XXXII' in FIG. 31.
Figure 33:
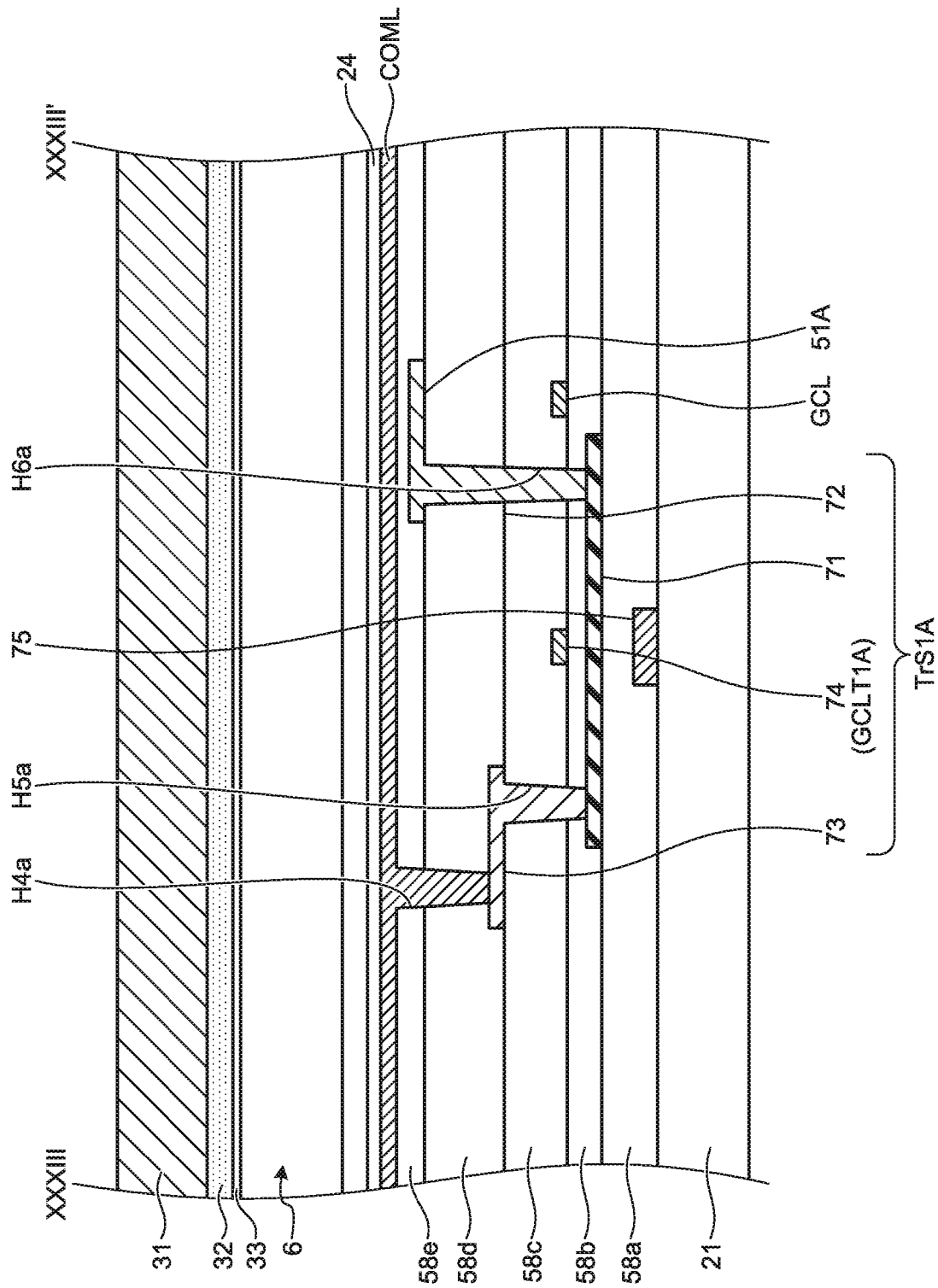
FIG. 33 is a sectional view along line XXXIII-XXXIII' in FIG. 30.
Figure 34:
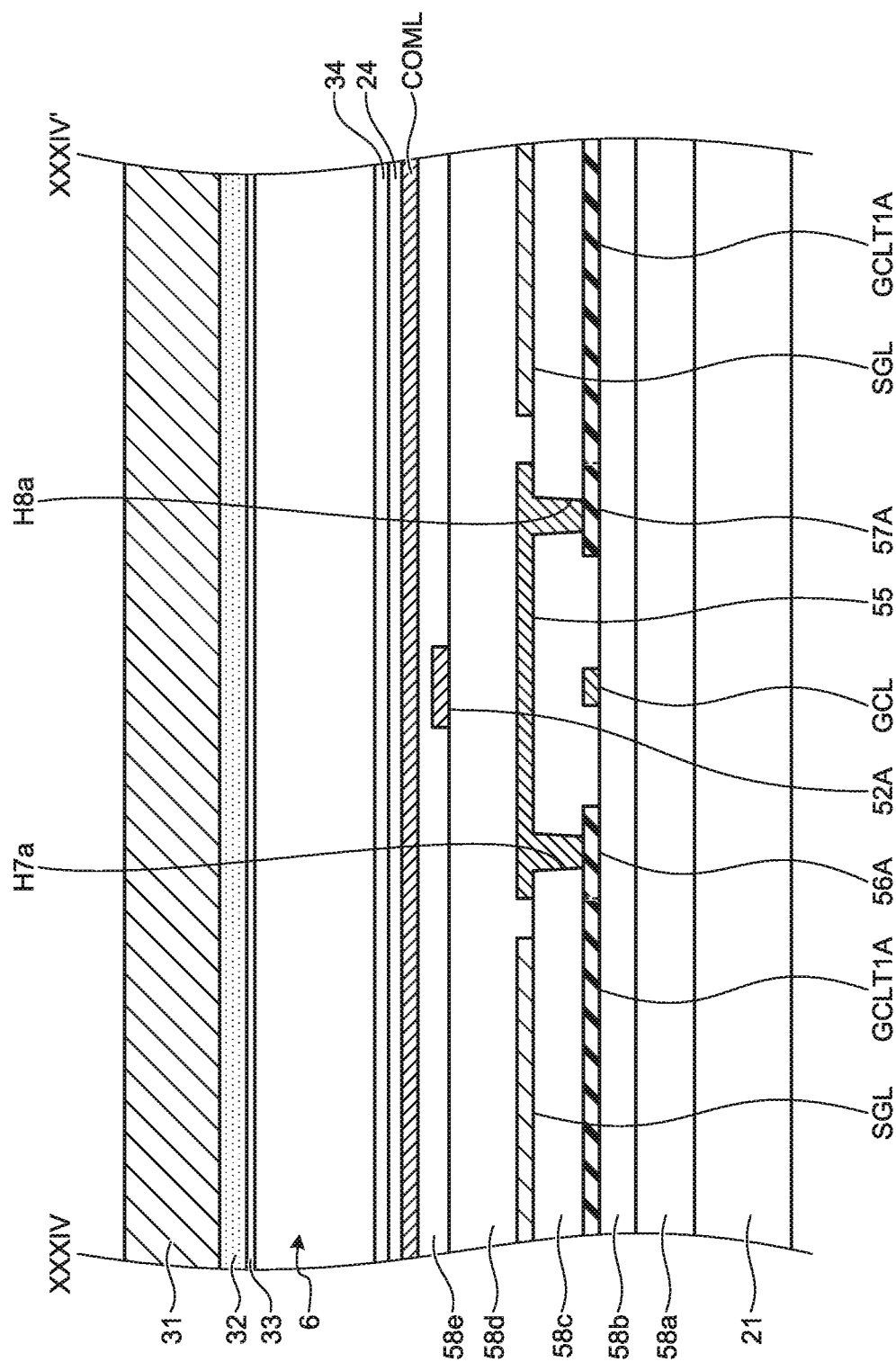
FIG. 34 is a sectional view along line XXXIV-XXXIV' in FIG. 30.

The following describes the coupling configuration between the detection electrodes COML and the various kinds of wires and the coupling configuration between the pixel electrodes 22 and the various kinds of wires. FIG. 29 is a plan view for explaining the configuration of the detection electrodes and the pixel electrodes according to the third embodiment. FIG. 30 is a plan view for explaining the configuration of the sub-pixel according to the third embodiment. FIG. 31 is a plan view for explaining the configuration of another sub-pixel according to the third embodiment. FIG. 32 is a sectional view along line XXXII-XXXII' in FIG. 31. FIG. 33 is a sectional view along line XXXIII-XXXIII' in FIG. 30. FIG. 34 is a sectional view along line XXXIV-XXXIV' in FIG. 30.

As illustrated in FIG. 29, the display gate lines GCL extend in the row direction and are arrayed in the column direction. The display signal lines SGL intersect the display gate lines GCL and are arrayed in the row direction. The display switching elements TrD are disposed at the respective intersections of the display gate lines GCL and the display signal lines SGL.

The first gate line for detection GCLT1A extends along a display signal line SGL. The second gate line for detection GCLT2A extend along another display signal line SGL different from the display signal line SGL facing the first gate line for detection GCLT1A. The first signal line 51A extends along a display gate line GCL. The second signal line 52A extends along another display gate line GCL different from the display gate line GCL under the first signal line 51A. The first signal line 51A and the second signal line 52A are provided overlapping the respective display gate lines GCL in planar view.

The first switching element TrS1A is disposed at the intersection of the first gate line GCLT1A and the first signal line 51A. The second switching element TrS2A is disposed at the intersection of the second gate line GCLT2A and the second signal line 52A. The detection electrode COML is coupled to the first signal line 51A via the first switching element TrS1A and to the second signal line 52A via the second switching element TrS2A.

As illustrated in FIGS. 29 and 30, the first gate lines GCLT1A are disposed under the respective display signal lines SGL in planar view. The first gate line GCLT1A is provided between the display gate lines GCL facing each other. Ends of the first gate line GCLT1A face the sides of the respective display gate lines GCL with a space interposed therebetween.

A first coupler 56A is provided to one end of the first gate line GCLT1A, and a second coupler 57A is provided to the other end thereof. The first coupler 56A and the second coupler 57A protrude to positions not covered with the display signal line SGL. A bridge 55A extends along the display signal line SGL at a position not covered with the display signal line SGL. The bridge 55A intersects the display gate line GCL in planar view and couples the first coupler 56A and the second coupler 57A. With this configuration, a plurality of first gate lines GCLT1A are electrically coupled in the direction intersecting the display gate lines GCL.

As illustrated in FIGS. 29 and 31, the second gate lines GCLT2A are disposed under the respective display signal lines SGL in planar view. The second gate lines GCLT2A is provided between the display gate lines GCL facing each other. Ends of the second gate lines GCLT2A face the sides of the respective display gate lines GCL with a space interposed therebetween.

A first coupler 56B is provided to one end of the second gate line GCLT2A, and a second coupler 57B is provided to the other end thereof. The first coupler 56B and the second coupler 57B protrude to positions not covered with the display signal line SGL. A bridge 55B extends along the display signal line SGL at a position not covered with the display signal line SGL. The bridge 55B intersects the display gate line GCL in planar view and couples the first coupler 56B and the second coupler 57B. With this configuration, a plurality of second gate lines GCLT2A are electrically coupled in the direction intersecting the display gate lines GCL.

As illustrated in FIG. 32, the coupling configuration of the display switching element TrD is the same as that of the first embodiment. As illustrated in FIG. 32, the second gate line GCLT2A is provided to the same layer as that of the display gate line GCL. The second gate line GCLT2A is disposed below the display signal line SGL with the insulating layer 58c interposed therebetween. The second coupler 57B is coupled to the second gate line GCLT2A and provided to the same layer as that of the second gate line GCLT2A. The first coupler 56B, which is not illustrated, is also provided to the same layer as that of the second gate line GCLT2A. The bridge 55B is provided to the same layer as that of the display signal line SGL above the second coupler 57B with the insulating layer 58c interposed therebetween. The bridge 55B is coupled to the second coupler 57B through a contact hole H8b.

As illustrated in FIGS. 30 and 33, the detection electrode COML is coupled to the drain electrode 73 of the first switching element TrS1A through a contact hole H4a. The semiconductor layer 71 is coupled to the drain electrode 73 through a contact hole H5a. The semiconductor layer 71 intersects the gate electrode 74 in planar view. The gate electrode 74 is coupled to the first gate line GCLT1A and protrudes from one side of the first gate line GCLT1A. In other words, part of the first gate line GCLT1A functions as the gate electrode 74.

The semiconductor layer 71 extends to a position under the source electrode 72 and is electrically coupled to the source electrode 72 through a contact hole H6a. The source electrode 72 protrudes from one side of the first signal line 51A. In other words, part of the first signal line 51A functions as the source electrode 72. As illustrated in FIG. 33, the first gate line GCLT1A is provided to the same layer as that of the display gate line GCL.

As illustrated in FIGS. 30 and 34, the first coupler 56A and the second coupler 57A coupled to the first gate line GCLT1A are provided to the same layer as that of the display gate line GCL. The first coupler 56A is disposed on one side of the display gate line GCL, and the second coupler 57A is disposed on the other side thereof. The bridge 55A is disposed above the display gate line GCL, the first coupler 56A, and the second coupler 57A with the insulating layer 58c interposed therebetween. One end of the bridge 55A is coupled to the first coupler 56A through a contact hole H7a. The other end of the bridge 55A is coupled to the second coupler 57A through a contact hole H8a. With this coupling configuration, the first gate line GCLT1A provided on one side of the display gate line GCL and the first gate line GCLT1A provided on the other side thereof are electrically coupled via the bridge 55A.

With the same configuration as that illustrated in FIG. 34, the second gate lines GCLT2A are electrically coupled via the first coupler 56B, the bridge 55B, and the second coupler 57B, which is not illustrated.

As described above, the first gate lines GCLT1A and the second gate lines GCLT2A extend in the direction intersecting the display gate lines GCL in the display device 1B according to the present embodiment. With this configuration, the detection gate driver 12B can be provided at a position different from that of the display gate driver 12A. Specifically, as illustrated in FIG. 27, for example, the circuits, such as the shift register 12Aa, included in the display gate driver 12A are provided on the long side of the frame area 10b. The circuits, such as the shift register 12Ba, included in the detection gate driver 12B are provided on the short side of the frame area 10b. Consequently, the display device 1B according to the present embodiment can advantageously have a narrower frame than the configuration where the display gate driver 12A and the detection gate driver 12B are provided to the same side of the frame area 10b.

While exemplary embodiments according to the present invention have been described, the embodiments are not intended to limit the invention. The contents disclosed in the embodiments are given by way of example only, and various changes may be made without departing from the spirit of the invention. Appropriate changes made without departing from the spirit of the invention naturally fall within the technical scope of the invention.

The shapes, the positions, and the numbers of the pixel electrodes 22 and the detection electrodes COML, for example, are given by way of example only and may be appropriately modified. While self-capacitance touch detection has been described above, the present invention is also applicable to a configuration that performs mutual capacitance touch detection. In this case, detection electrodes may be provided to the second substrate 31, and the detection electrodes COML may be used as drive electrodes, for example.

What is claimed is:

1. A display device comprising:
a substrate;
a plurality of detection electrodes provided in a display area of the substrate;
a drive circuit configured to supply a drive signal to the detection electrodes;
a detector configured to receive, from the detection electrodes, a detection signal corresponding to a capacitance change in the detection electrodes occurring when the drive signal is supplied;
a first switching circuit coupled to the detector via wiring and provided between the detection electrodes and the detector; and
a controller configured to output a control signal to the first switching circuit,
wherein
the first switching circuit changes number of detection electrodes electrically coupled to one of the wiring based on the detection signal, and
the controller has a first detection mode to electrically couple two or more of the detection electrodes to one of the wiring and detect an object to be detected in proximity to a display surface when the detection signal is smaller than a predetermined threshold and a second detection mode to electrically couple one of the detection electrodes to one of the wiring and detect the object to be detected in contact with the display surface when the detection signal is equal to or larger than the predetermined threshold.

2. The display device according to claim 1, wherein the detection electrodes are disposed in a matrix (row-column configuration) in the display area.

3. The display device according to claim 1, further comprising:
a plurality of pixel electrodes facing the detection electrodes in a direction perpendicular to the substrate;
a display functional layer configured to display an image in the display area; and
display signal lines configured to supply a pixel signal to the pixel electrodes, wherein
the drive circuit supplies a display drive signal serving as a common potential for the pixel electrodes to the detection electrodes.

4. A display device comprising:
a substrate;
a plurality of detection electrodes provided in a display area of the substrate;
a drive circuit configured to supply a drive signal to the detection electrodes;
a detector configured to receive, from the detection electrodes, a detection signal corresponding to a capacitance change in the detection electrodes occurring when the drive signal is supplied;
a first switching circuit coupled to the detector via wiring and provided between the detection electrodes and the detector;
first switching elements provided corresponding to the respective detection electrodes;
a gate drive circuit configured to supply a first scanning signal to the first switching elements;
first signal lines configured to couple the first switching elements to the first switching circuit; and
first gate lines configured to couple the first switching elements to the gate drive circuit,
wherein
the first switching circuit changes number of detection electrodes electrically coupled to one of the wiring based on the detection signal, and
the drive circuit supplies the drive signal to the detection electrodes via the first signal lines.

5. The display device according to claim 4, wherein the first switching circuit includes a first sensor switcher provided between the first signal lines, and a second sensor switcher provided between a first signal line out of the first signal lines and the wiring.

6. The display device according to claim 4, wherein the gate drive circuit changes number of first gate lines simultaneously supplied with the first scanning signal based on the detection signal.

7. The display device according to claim 4, wherein a first signal line out of the first signal lines is disposed under the detection electrodes and coupled to the first switching elements corresponding to the respective detection electrodes.

8. The display device according to claim 4, further comprising:
second switching elements provided corresponding to the respective detection electrodes besides the first switching elements;
second signal lines configured to couple the second switching elements to the drive circuit; and
second gate lines configured to couple the second switching elements to the gate drive circuit, wherein the drive circuit supplies, via the second signal lines, a guard signal synchronized with the drive signal and having the same electric potential as the electric potential of the drive signal to the detection electrodes not supplied with the drive signal.

9. The display device according to claim 8, wherein the gate drive circuit supplies a second scanning signal having a polarity opposite to a polarity of the first scanning signal to the second gate lines.

10. The display device according to claim 4, further comprising:
   a plurality of pixel electrodes facing the detection electrodes in a direction perpendicular to the substrate;
   a display functional layer configured to display an image in the display area; and
   display signal lines configured to supply a pixel signal to the pixel electrodes, wherein
   the first signal lines are provided overlapping the display signal lines in a layer different from a layer of the display signal lines.

11. The display device according to claim 10, further comprising:
   display switching elements coupled to the pixel electrodes; and
   display gate lines coupled to the display switching elements, wherein
   the first gate lines are provided along the display gate lines.

12. The display device according to claim 4, further comprising:
   a plurality of pixel electrodes facing the detection electrodes in a direction perpendicular to the substrate;
   a display functional layer configured to display an image in the display area;
   display signal lines configured to supply a pixel signal to the pixel electrodes; and
   a display driver configured to supply the pixel signal to the display signal lines, wherein
   a display signal line out of the display signal lines disposed under the detection electrodes also serves as the first signal line.

13. The display device according to claim 12, further comprising a second switching circuit configured to switch between coupling of the first signal lines to the display driver and coupling of the first signal lines to the first switching circuit.

14. The display device according to claim 12, wherein
   the drive circuit supplies the drive signal to the detection electrodes via the first signal lines when the first scanning signal is at a high level, and
   the display driver supplies the pixel signal to the pixel electrodes via the first signal lines when the first scanning signal is at a low level.

15. The display device according to claim 4, further comprising:
   a plurality of pixel electrodes facing the detection electrodes in a direction perpendicular to the substrate;
   display switching elements coupled to the pixel electrodes; and
   display gate lines configured to couple the display switching elements and a display gate drive circuit that supplies a gate signal to the display switching elements, wherein
   the first gate lines extend in a direction intersecting the display gate lines in planar view.

16. The display device according to claim 15, wherein
   the first gate lines are provided to the same layer as a layer of the display gate lines and arrayed in the direction intersecting the display gate lines, and
   the first gate line provided on a first side of the display gate line and the first gate line provided on a second side of the display gate line are electrically coupled via a bridge provided to a layer different from the layer of the display gate line and intersecting the display gate line in planar view.

* * * * *